United States Patent
Song et al.

(10) Patent No.: US 11,374,153 B2
(45) Date of Patent: Jun. 28, 2022

(54) LIGHT EMITTING DEVICE PACKAGE

(71) Applicant: SUZHOU LEKIN SEMICONDUCTOR CO., LTD., Taicang (CN)

(72) Inventors: June O Song, Seoul (KR); Ki Seok Kim, Seoul (KR); Won Jung Kim, Seoul (KR)

(73) Assignee: SUZHOU LEKIN SEMICONDUCTOR CO., LTD., Suzhou (CN)

(*) Notice: Subject to any disclaimer, the term of this patent is extended or adjusted under 35 U.S.C. 154(b) by 146 days.

(21) Appl. No.: 16/756,952

(22) PCT Filed: Oct. 16, 2018

(86) PCT No.: PCT/KR2018/012165
§ 371 (c)(1),
(2) Date: Apr. 17, 2020

(87) PCT Pub. No.: WO2019/078575
PCT Pub. Date: Apr. 25, 2019

(65) Prior Publication Data
US 2021/0193877 A1    Jun. 24, 2021

(30) Foreign Application Priority Data
Oct. 20, 2017  (KR) .................. 10-2017-0136825

(51) Int. Cl.
*H01L 33/48* (2010.01)
*H01L 33/62* (2010.01)
(Continued)

(52) U.S. Cl.
CPC .......... *H01L 33/483* (2013.01); *H01L 25/167* (2013.01); *H01L 33/62* (2013.01); *H01L 25/0753* (2013.01); *H01L 2933/0033* (2013.01)

(58) Field of Classification Search
CPC ..... H01L 33/483; H01L 33/486; H01L 33/62; H01L 25/0753; H01L 33/60; H01L 2933/0033; H01L 25/167
See application file for complete search history.

(56) References Cited

U.S. PATENT DOCUMENTS

| 2006/0138615 A1 | 6/2006 | Sato et al. |
| 2014/0197438 A1 | 7/2014 | Oh et al. |

(Continued)

FOREIGN PATENT DOCUMENTS

| JP | 2015-226056 A | 12/2015 |
| KR | 10-2014-0091857 A | 7/2014 |

(Continued)

*Primary Examiner* — Feifei Yeung Lopez
(74) *Attorney, Agent, or Firm* — Birch, Stewart, Kolasch & Birch, LLP

(57) ABSTRACT

A light emitting device package according to an embodiment may include: a first frame including a first opening passing through upper and lower surfaces, and a second frame spaced apart from the first frame and including a second opening; first and second conductive layers disposed in the first and second openings, respectively; a body disposed between the first and second frames; a first resin disposed on the body; and a light emitting device disposed on the first resin. According to an embodiment, the light emitting device may include a first bonding part electrically connected with the first frame and a second bonding part spaced apart from the first bonding part and electrically connected with the second frame, and the first and second bonding parts may be disposed on the first and second openings, respectively. According to an embodiment, the first and second frames may include first and second metal layers having third and fourth openings passing through upper and lower surfaces around the first and second openings, respectively, and widths of the first and second bonding parts in a horizontal (Continued)

direction may be greater than widths of upper surfaces of the first and second openings in the horizontal direction.

20 Claims, 11 Drawing Sheets

(51) Int. Cl.
  *H01L 25/16* (2006.01)
  *H01L 25/075* (2006.01)

(56) References Cited

U.S. PATENT DOCUMENTS

| | | | |
|---|---|---|---|
| 2017/0040516 A1 | 2/2017 | Fukuda | |
| 2019/0074410 A1* | 3/2019 | Lim | H01L 23/49827 |
| 2020/0303596 A1* | 9/2020 | Lim | H01L 33/20 |

FOREIGN PATENT DOCUMENTS

| KR | 10-2014-0145410 A | 12/2014 |
|---|---|---|
| KR | 10-2015-0104383 A | 9/2015 |

* cited by examiner

[FIG. 1]
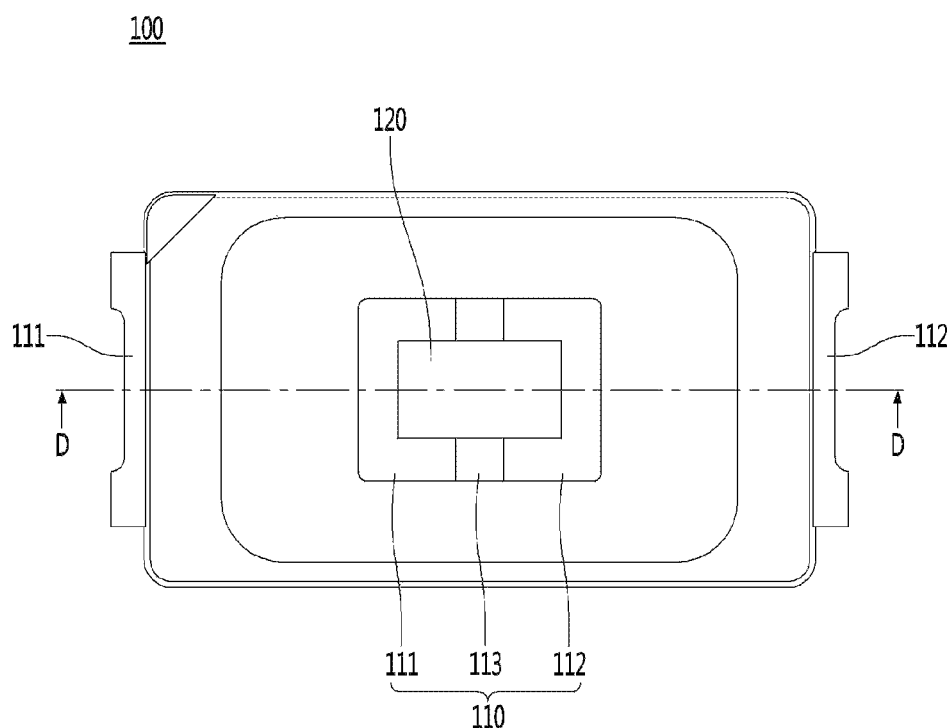

【FIG. 2】
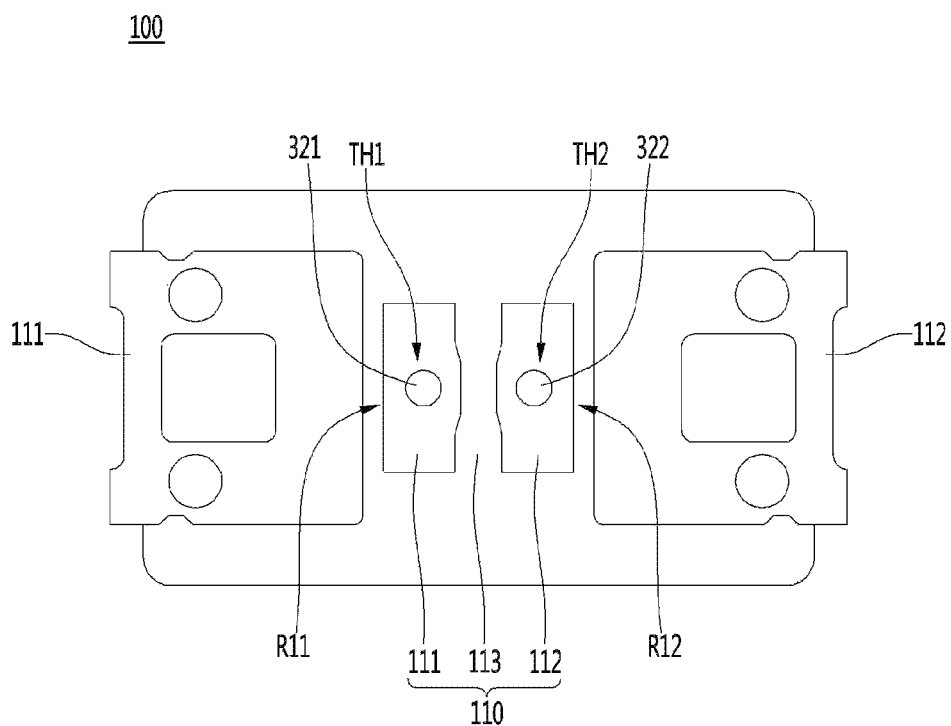

[FIG. 3]
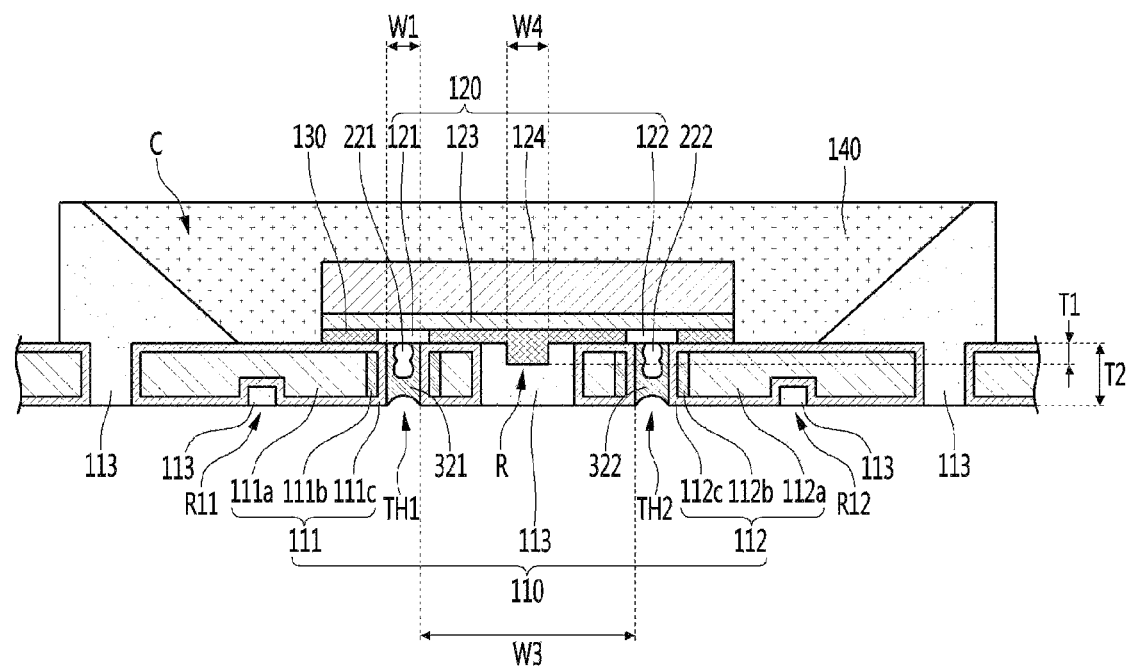

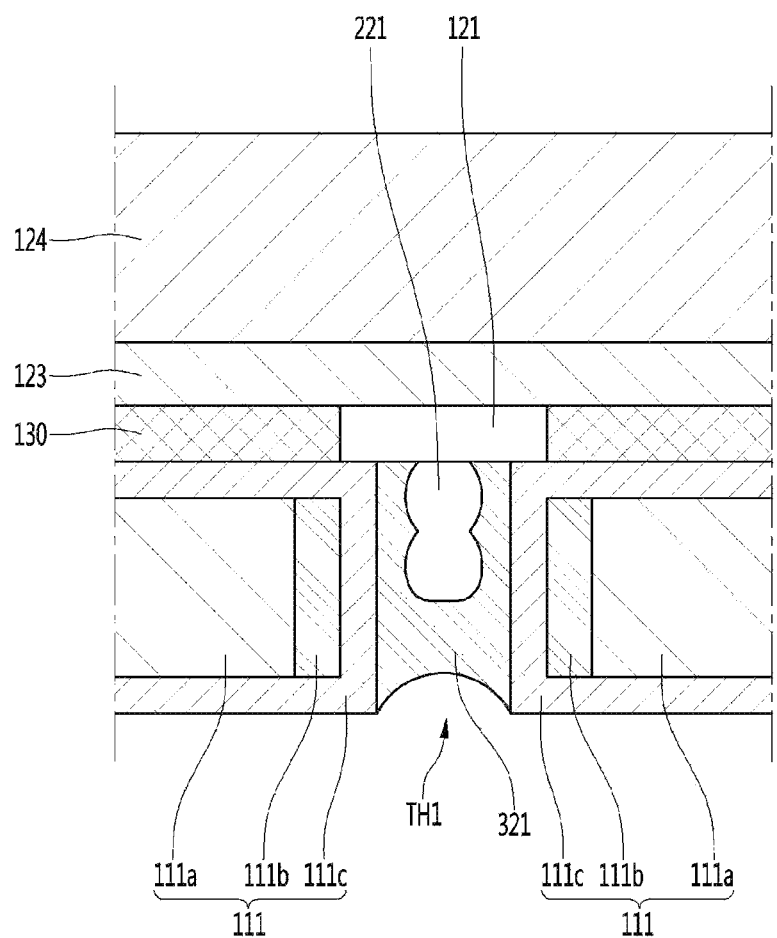
[FIG. 4]

[FIG. 5]
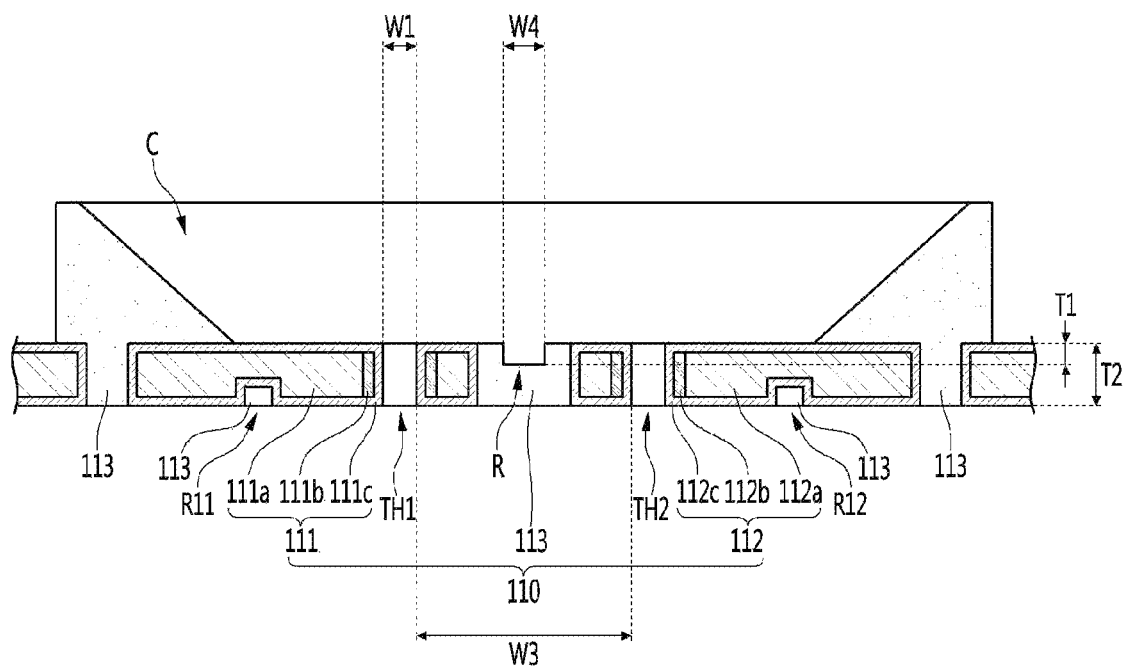
[FIG. 6]
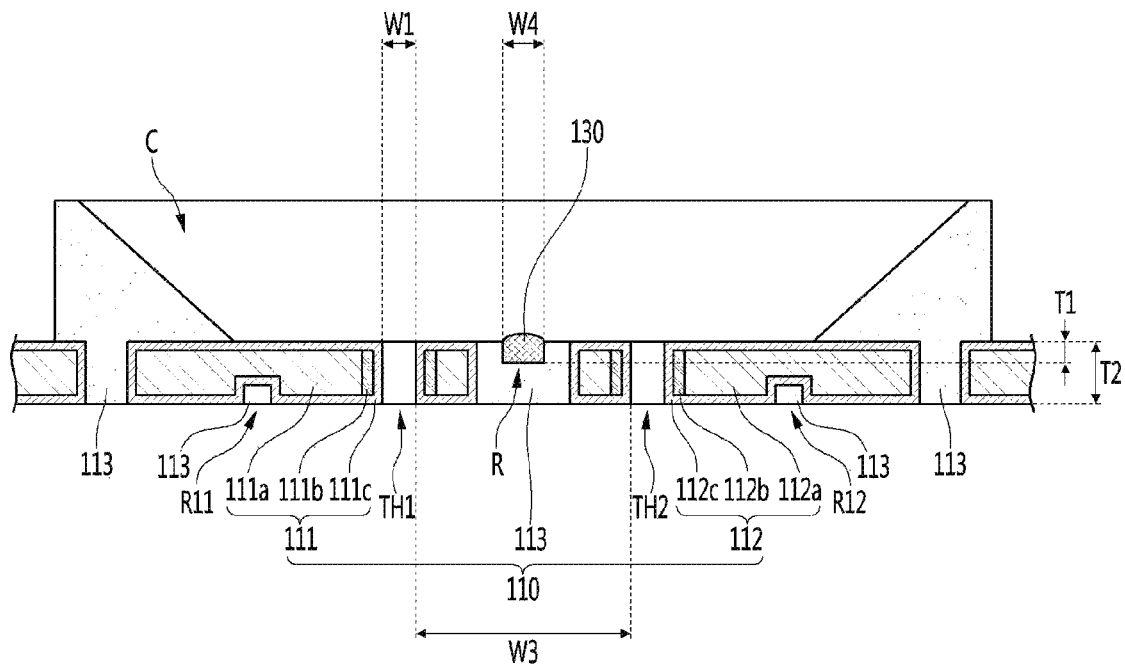

[FIG. 7]
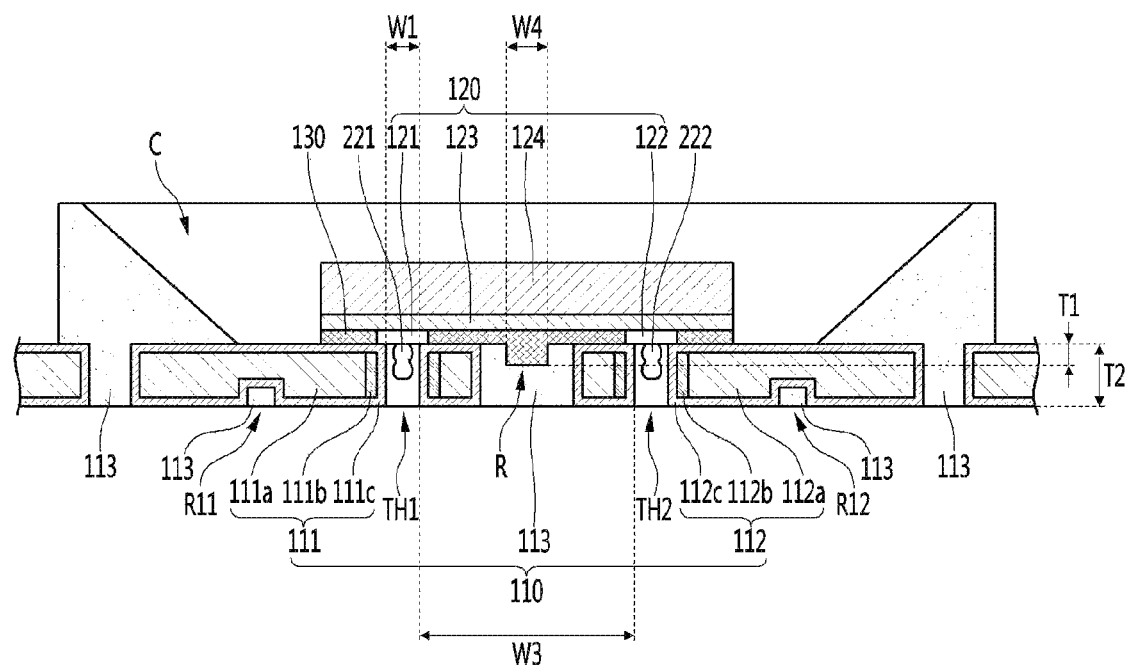

[FIG. 8]
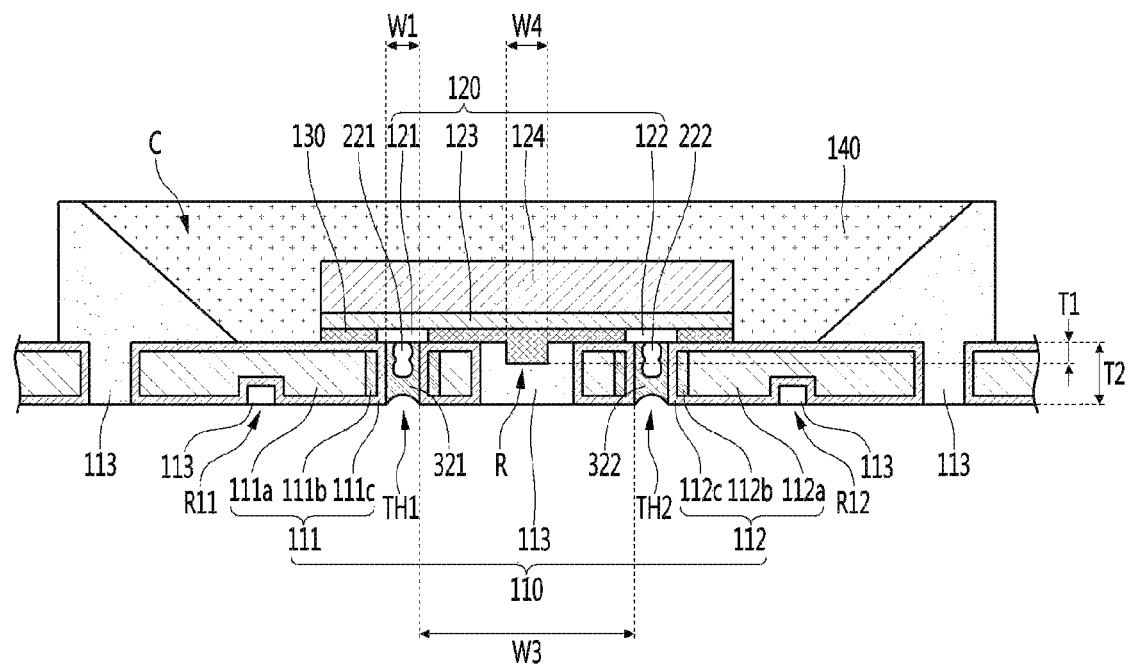

[FIG. 9]
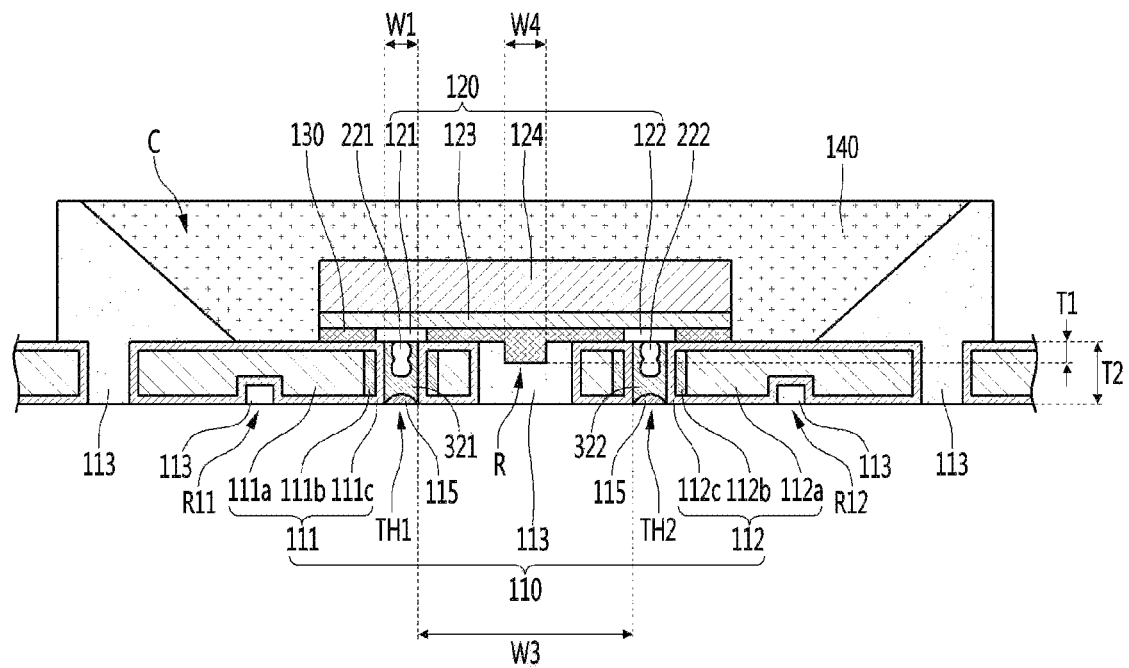

[FIG. 10]
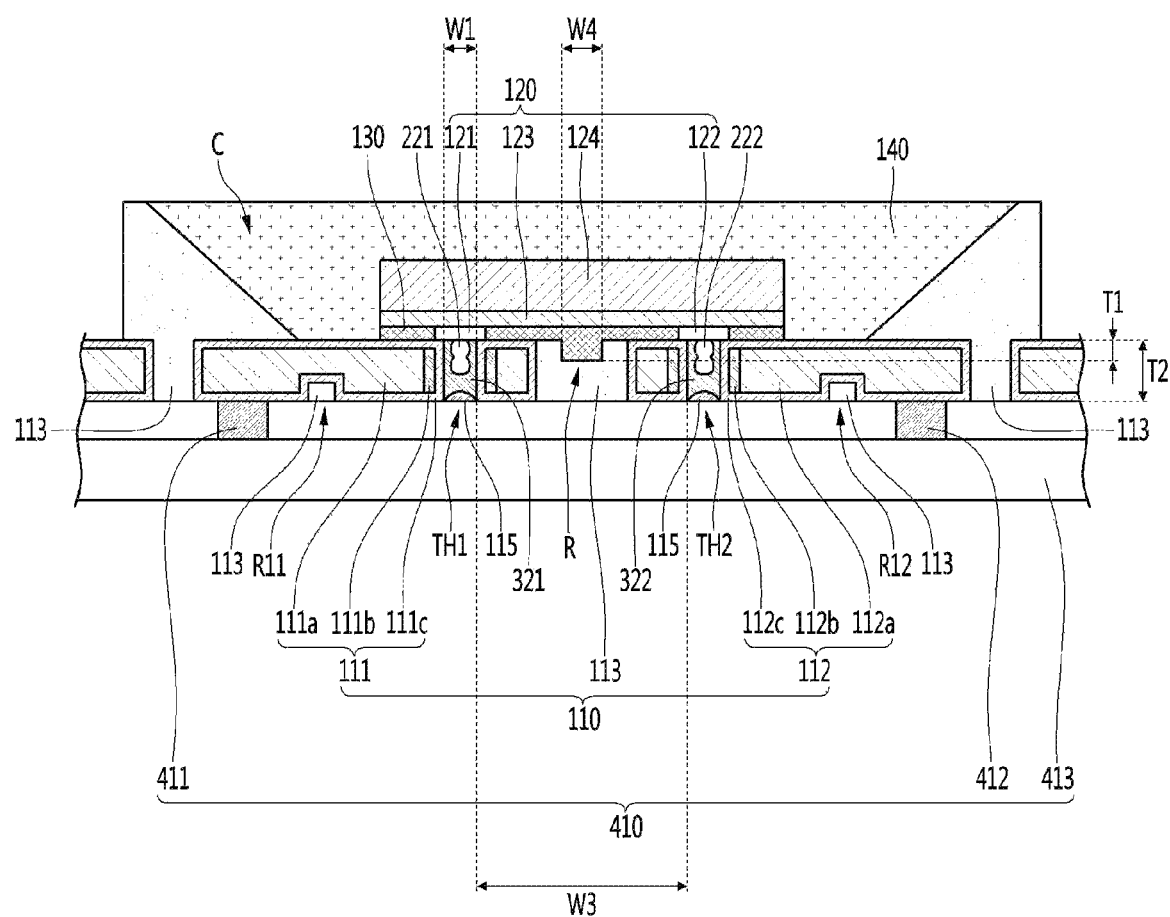

[FIG. 11]
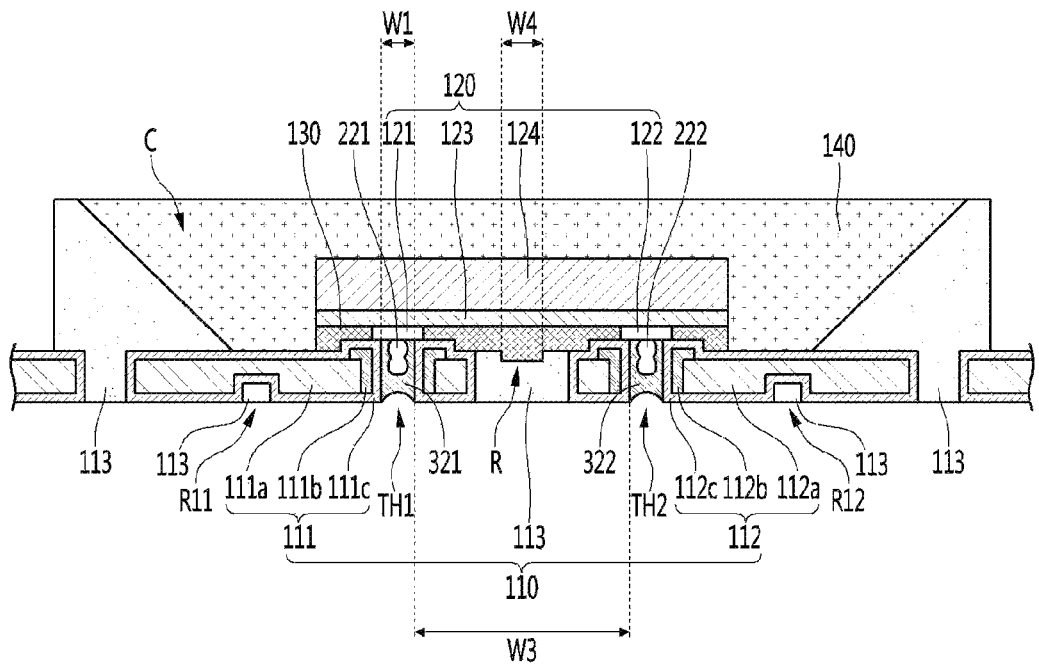
[FIG. 12]
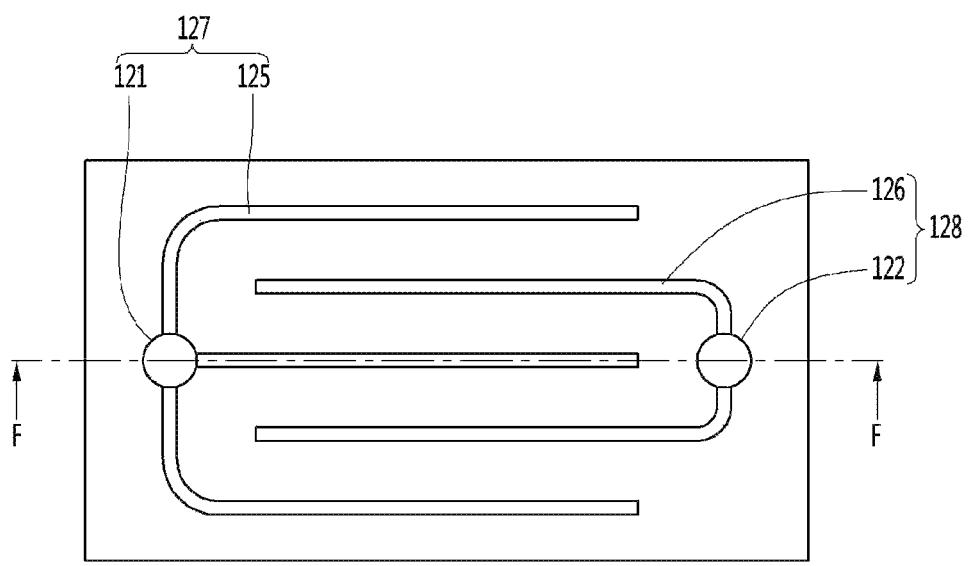

【FIG. 13】
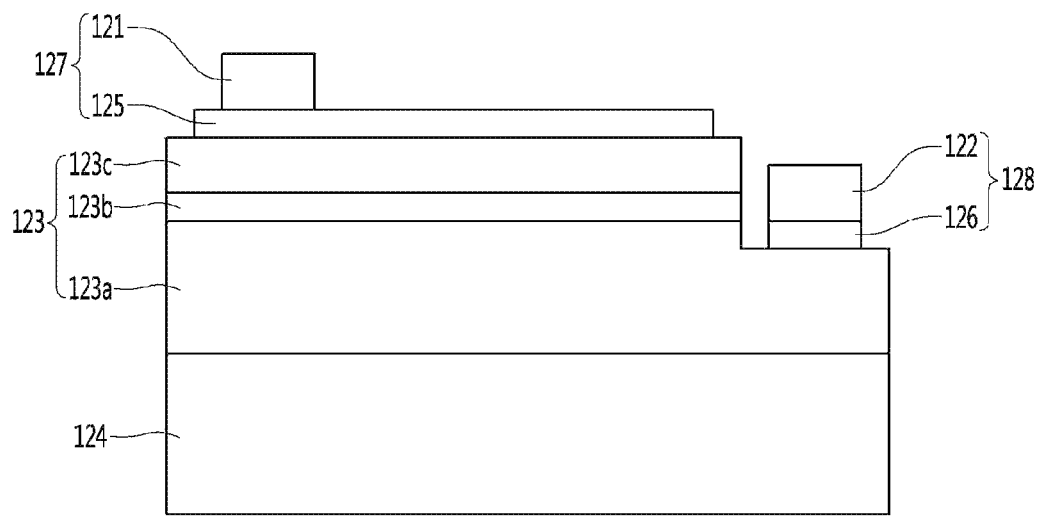
【FIG. 14】
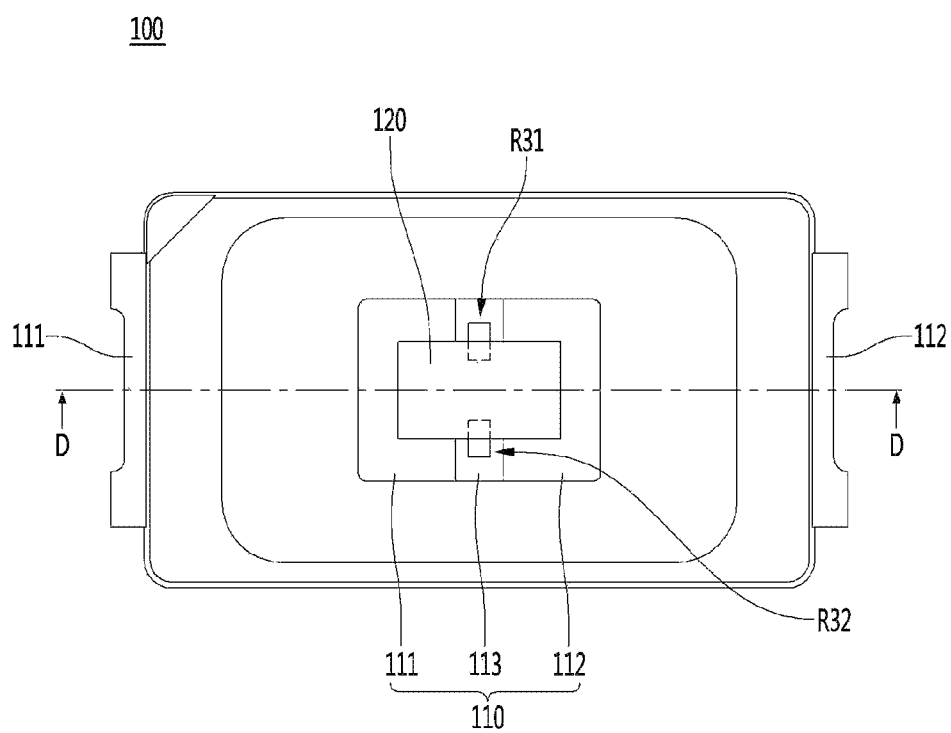

LIGHT EMITTING DEVICE PACKAGE

CROSS REFERENCE TO RELATED APPLICATIONS

This application is the National Phase of PCT/KR2018/012165 filed on Oct. 16, 2018, which claims priority under 35 U.S.C. § 119(a) to Patent Application No. 10-2017-0136825 filed in the Republic of Korea on Oct. 20, 2017, all of which are hereby expressly incorporated by reference into the present application.

TECHNICAL FIELD

Embodiments relate to a semiconductor device package, a method of manufacturing a semiconductor device package, and a light source device.

BACKGROUND ART

A semiconductor device comprising compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using a group III-V or a group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using a group III-V or a group II-VI compound semiconductor substances can implement a white light source having high efficiency by using fluorescent substances or combining colors. Such a semiconductor device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using a group III-V or a group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication means, a light emitting diode backlight replacing a cold cathode fluorescence lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been commercialized and extensively used.

For example, an ultraviolet light emitting device may be used as a light emitting diode that emits light distributed in a wavelength range of 200 nm to 400 nm, used for sterilization and purification in the case of a short wavelength in the wavelength band, and used for an exposure machine, a curing machine, or the like in the case of a long wavelength.

Ultraviolet rays may be divided into three groups of UV-A (315 nm to 400 nm), UV-B (280 nm to 315 nm) and UV-C (200 nm to 280 nm) in the order of long wavelength. The UV-A (315 nm to 400 nm) has been applied to various fields such as UV curing for industrial use, curing of printing ink, an exposure machine, discrimination of counterfeit, photo-catalytic disinfection, special illumination (aquarium/agriculture and the like), the UV-B (280 nm to 315 nm) has been used for medical use, and the UV-C (200 nm to 280 nm) has been applied to air purification, water purification, sterilization products, and the like.

Meanwhile, as a semiconductor device capable of providing a high output has been requested, a semiconductor device capable of increasing an output by applying a high power source has been studied.

In addition, research on a method of improving the light extraction efficiency of a semiconductor device and enhancing the luminous intensity in a package stage in a semiconductor device package has been studied. Further, in the semiconductor device package, studies on a method of enhancing the bonding strength between the package electrode and the semiconductor device have been performed.

In addition, research on a method of reducing the manufacturing cost and improving the manufacturing yield by improving the process efficiency and changing the structure in a semiconductor device package has been studied.

SUMMARY

Embodiments can provide a semiconductor device package, a method of manufacturing a semiconductor device package, and a light source device, that are capable of improving light extraction efficiency and electrical characteristics.

Embodiments can provide a semiconductor device package, a method of manufacturing a semiconductor device package, and a light source device, that are capable of reducing manufacturing cost and improving manufacturing yield by improving process efficiency and providing new package structure.

Embodiments can provide a semiconductor device package and a method of manufacturing a semiconductor device package that are capable of preventing a re-melting phenomenon from occurring in a bonding region of a semiconductor device package in a process of re-bonding the semiconductor device package to a board or the like.

A light emitting device package according to an embodiment may comprise a first frame comprising a first opening passing through an upper surface and a lower surface, and a second frame spaced apart from the first frame and comprising a second opening; first and second conductive layers disposed in the first and second openings, respectively; a body disposed between the first and second frames; a first resin disposed on the body; and a light emitting device disposed on the first resin, wherein the light emitting device may comprise a first bonding part electrically connected with the first frame, and a second bonding part spaced from the first bonding part and electrically connected with the second frame, wherein the first and second bonding parts may be disposed on the first and second openings, respectively, and the first and second frames may comprise first and second metal layers including third and fourth openings passing through upper and lower surfaces around the first and second openings, respectively, and widths of the first and second bonding parts in a horizontal direction may be greater than widths of upper surfaces of the first and second openings in the horizontal direction.

According to an embodiment, the first frame may comprise a first metal layer, a third metal layer disposed on a side surface of the first metal layer, and a fifth metal layer disposed on a side surface of the third metal layer, and disposed on an upper surface of the first metal layer, and the fifth metal layer disposed on the side surface of the third metal layer may be disposed around the first conductive layer provided in the first opening.

The light emitting device package according to an embodiment may comprise a first conductor being contact with a lower surface of the first bonding part and disposed in the first opening, and a second conductor being contact with a lower surface of the second bonding part and disposed in the second opening.

According to an embodiment, the body may comprise a recess recessed in a direction toward the lower surface from the upper surface of the body, and the first resin may be disposed in the recess.

According to an embodiment, the first and second frames may comprise a lower recess recessed in a direction from the lower surface toward the upper surface.

The light emitting device package according to an embodiment may comprise a resin layer disposed in the lower recess.

According to an embodiment, the widths of the first and second bonding parts and the widths of the first and second openings may be provided of several tens of micrometers.

According to an embodiment, the second frame may comprise a second metal layer, a fourth metal layer disposed on a side surface of the second metal layer, and a sixth metal layer disposed on a side surface of the fourth metal layer and disposed on an upper surface of the second metal layer, and the sixth metal layer disposed on the side of the fourth metal layer may be provided around the second conductive layer provided in the second opening.

According to an embodiment, the first conductive layer may be disposed in contact with a lower surface of the first bonding part and a periphery of the first conductor.

According to an embodiment, an alloy layer formed of a first metal included in the first conductive layer and a second metal included in the first frame may be disposed between the first conductive layer and the first frame.

Advantageous Effects

According to the semiconductor device package and the method of manufacturing the semiconductor device package of the embodiments, there is an advantage that light extraction efficiency, electrical characteristics and reliability can be improved.

According to the semiconductor device package and the method of manufacturing the semiconductor device package of the embodiments, there is an advantage that manufacturing cost can be reduced and manufacturing yield can be improved by improving process efficiency and providing new package structure.

The semiconductor device package according to the embodiment has an advantage that the reflector can be prevented from being discolored by providing the body with high reflectance, thereby improving the reliability of the semiconductor device package.

According to the semiconductor device package and the method of manufacturing the semiconductor device of the embodiments, there is an advantage that re-melting phenomenon can be prevented from occurring in the bonding region of the semiconductor device package in the process of re-bonding the semiconductor device package to a board or the like.

BRIEF DESCRIPTION OF THE DRAWINGS

FIG. 1 is a plan view of a light emitting device package according to an embodiment of the present invention.

FIG. 2 is a bottom view of the light emitting device package shown in FIG. 1.

FIG. 3 is a cross-sectional view taken along line D-D of the light emitting device package shown in FIG. 1.

FIG. 4 is an enlarged cross-sectional view illustrating a region of an opening of the light emitting device package shown in FIG. 1.

FIGS. 5 to 8 are views illustrating a method of manufacturing a light emitting device package according to an embodiment of the present invention.

FIG. 9 is a view showing another example of a light emitting device package according to an embodiment of the present invention.

FIG. 10 is a view showing another example of a light emitting device package according to an embodiment of the present invention.

FIG. 11 is a view illustrating another example of a light emitting device package according to an embodiment of the present invention.

FIG. 12 is a plan view illustrating an example of a light emitting device applied to a light emitting device package according to an embodiment of the present invention.

FIG. 13 is a cross-sectional view taken along line F-F of the light emitting device shown in FIG. 12.

FIG. 14 is a view showing another example of a light emitting device package according to an embodiment.

DETAILED DESCRIPTION

Hereinafter, an embodiment will be described with reference to accompanying drawings. In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings, but the embodiments are not limited thereto.

Hereinafter, a semiconductor device package and a method of manufacturing a semiconductor device package according to an embodiment of the present invention will be described in detail with reference to the accompanying drawings. Hereinafter, a case where a light emitting device is applied as an example of a semiconductor device will be described.

First, referring to FIGS. 1 to 4, a light emitting device package according to an embodiment of the present invention will be described.

FIG. 1 is a plan view of a light emitting device package according to an embodiment of the present invention, FIG. 2 is a bottom view of a light emitting device package according to an embodiment of the present invention, FIG. 3 is a cross-sectional view taken along line D-D of the light emitting device package shown in FIG. 1, and FIG. 4 is an enlarged cross-sectional view illustrating a region of an opening of the light emitting device package shown in FIG. 1.

The light emitting device package 100 according to the embodiment may comprise a package body 110 and a light emitting device 120 as shown in FIGS. 1 to 4.

The package body 110 may comprise a first frame 111 and a second frame 112. The first frame 111 and the second frame 112 may be spaced apart from each other.

The package body 110 may comprise a body 113. The body 113 may be disposed between the first frame 111 and the second frame 112. The body 113 may function as an electrode separation line. The body 113 may be referred to as an insulating member.

The body 113 may be disposed on the first frame 111. In addition, the body 113 may be disposed on the second frame 112.

The body 113 may provide an inclined surface disposed on the first frame 111 and the second frame 112. A cavity C may be provided on the first frame 111 and the second frame 112 by an inclined surface of the body 113.

According to the embodiment, the package body 110 may be provided with a cavity C, or may be provided with a flat upper surface without a cavity C.

For example, the body 113 may be formed of at least one selected from a group including polyphthalamide (PPA), polychloro tri phenyl (PCT), liquid crystal polymer (LCP), polyamide 9T (PA9T), silicone, epoxy molding compound (EMC), silicon molding compound (SMC), ceramics, photo sensitive glass (PSG), sapphire ($Al_2O_3$), and the like. In addition, the body 113 may comprise a high refractive index filler such as $TiO_2$ and $SiO_2$.

The first frame 111 and the second frame 112 may be provided as a conductive frame. The first frame 111 and the second frame 112 can stably provide the structural strength of the package body 110 and can be electrically connected to the light emitting device 120.

According to the embodiment, the light emitting device 120 may comprise a first bonding part 121, a second bonding part 122, a light emitting structure 123, and a substrate 124.

The light emitting structure 123 may comprise a first conductivity type semiconductor layer, a second conductivity type semiconductor layer, and an active layer disposed between the first conductivity type semiconductor layer and the second conductivity type semiconductor layer. The first bonding part 121 may be electrically connected to the first conductivity type semiconductor layer. In addition, the second bonding part 122 may be electrically connected to the second conductivity type semiconductor layer.

The light emitting device 120 may be disposed on the package body 110. The light emitting device 120 may be disposed on the first frame 111 and the second frame 112. The light emitting device 120 may be disposed in the cavity C provided by the package body 110.

The first bonding part 121 may be disposed on a lower surface of the light emitting device 120. The second bonding part 122 may be disposed on the lower surface of the light emitting device 120. The first bonding part 121 and the second bonding part 122 may be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

Each of the first bonding part 121 and the second bonding part 122 may be provided as a single layer or a multilayer by using one or more materials selected from a group including Ti, Al, Sn, In, Ir, Ta, Pd, Co, Cr, Mg, Zn, Ni, Si, Ge, Ag, Ag alloy, Au, Hf, Pt, Ru, Rh, ZnO, $IrO_x$, $RuO_x$, NiO, $RuO_x$/ITO, Ni/$IrO_x$/Au, and Ni/$IrO_x$/Au/ITO, or an alloy thereof.

Meanwhile, as shown in FIGS. 1 to 4, the light emitting device package 100 according to the embodiment may comprise a first opening TH1 and a second opening TH2. The first frame 111 may comprise the first opening TH1. The second frame 112 may comprise the second opening TH2.

The first opening TH1 may be provided in the first frame 111. The first opening TH1 may be provided passing through the first frame 111. The first opening TH1 may be provided passing through the upper surface and the lower surface of the first frame 111 in a first direction.

The first opening TH1 may be disposed under the first bonding part 121 of the light emitting device 120. The first opening TH1 may be provided to overlap with the first bonding part 121 of the light emitting device 120. The first opening TH1 may be provided to overlap with the first bonding part 121 of the light emitting device 120 in a first direction toward the lower surface from the upper surface of the first frame 111. The first bonding part 121 may be disposed on the first opening TH1.

The second opening TH2 may be provided in the second frame 112. The second opening TH2 may be provided passing through the second frame 112. The second opening portion TH2 may be provided passing through the upper surface and the lower surface of the second frame 112 in a first direction.

The second opening TH2 may be disposed under the second bonding part 122 of the light emitting device 120. The second opening TH2 may be provided to overlap with the second bonding part 122 of the light emitting device 120. The second opening TH2 may be provided to overlap with the second bonding part 122 of the light emitting device 120 in a first direction toward the lower surface from the upper surface of the second frame 112. The second bonding part 122 may be disposed on the second opening TH2.

The first opening TH1 and the second opening TH2 may be spaced apart from each other. The first opening TH1 and the second opening TH2 may be spaced apart from each other under the lower surface of the light emitting device 120.

According to the embodiment, the width W1 of the upper region of the first opening TH1 may be provided less than or equal to the width of the first bonding part 121. In addition, the width of the upper region of the second opening TH2 may be provided less than or equal to the width of the second bonding part 122.

The area of the upper region of the first opening TH1 may be provided smaller than the area of the lower surface of the first bonding part 121. Also, the area of the upper region of the second opening TH2 may be provided smaller than the area of the lower surface of the second bonding part 122.

Accordingly, the first bonding part 121 of the light emitting device 120 and the first frame 111 can be more firmly attached. In addition, the second bonding part 122 of the light emitting device 120 and the second frame 112 can be more firmly attached.

Meanwhile, the first and second frames 111 and 112 may comprise a support member and a metal layer surrounding the support member.

According to the embodiment, after an etching process or a punching process for the support member is completed to form the first and second openings TH1 and TH2, a plating process or the like for the support members constituting the first and second frames 111 and 112 may be performed so that the metal layer may be formed. Accordingly, the metal layer may be formed on the surfaces of the support members constituting the first and second frames 111 and 112.

For example, the first frame 111 may comprise a first metal layer 111a, a third metal layer 111b, and a fifth metal layer 111c. In addition, the second frame 112 may comprise a second metal layer 112a, a fourth metal layer 112b, and a sixth metal layer 112c.

The first metal layer 111a and the second metal layer 112a may be referred to as supporting members for forming the first and second frames 111 and 112. The third, fourth, fifth, and sixth metal layers 111b, 112b, 111c, and 112c may be formed through a plating process, for example.

The third metal layer 111b may be disposed on a side surface of the first metal layer 111a. The third metal layer 111b may be disposed between the first metal layer 111a and the first opening TH1.

The fifth metal layer 111c may be disposed on the upper, lower, and side surfaces of the first metal layer 111a. The fifth metal layer 111c may be disposed on the upper, lower, and side surfaces of the third metal layer 111b. The fifth metal layer 111c may be disposed between the side surface of the third metal layer 111b and the first opening TH1.

The first metal layer 111a may be disposed around the first opening TH1. The first metal layer 111a may be disposed around the first opening TH1 to provide a greater opening than the first opening TH1. The third metal layer 111b may be disposed in the opening provided by the first metal layer 111a. Also, the fifth metal layer 111c may be disposed in the opening provided by the first metal layer 111a.

The size of the first opening TH1 provided to the first frame 111 can be determined by the thickness of the third metal layer 111b and the thickness of the fifth metal layer 111c. The size of the first opening TH1 may be controlled by controlling the thickness of the third metal layer 111b or the thickness of the fifth metal layer 111c. In addition, according to the embodiment, at least one of the third metal layer 111b and the fifth metal layer 111c may be omitted.

The fourth metal layer 112b may be disposed on a side surface of the second metal layer 112a. The fourth metal layer 112b may be disposed between the second metal layer 112a and the second opening TH2.

The sixth metal layer 112c may be disposed on the upper, lower, and side surfaces of the second metal layer 112a. The sixth metal layer 112c may be disposed on the upper, lower, and side surfaces of the fourth metal layer 112b. The sixth metal layer 112c may be disposed between the side surface of the fourth metal layer 112b and the second opening TH2.

The second metal layer 112a may be disposed around the second opening TH2. The second metal layer 112a may be disposed around the second opening TH2 to provide a greater opening than the second opening TH2. The third metal layer 112b may be disposed in the opening provided by the second metal layer 112a. In addition, the sixth metal layer 112c may be disposed in the opening provided by the second metal layer 112a.

The size of the second opening TH2 provided to the second frame 112 may be determined by the thickness of the fourth metal layer 112b and the thickness of the sixth metal layer 113c. The size of the second opening TH2 can be adjusted by adjusting the thickness of the fourth metal layer 112b or the thickness of the sixth metal layer 112c. In addition, according to the embodiment, at least one of the fourth metal layer 112b and the sixth metal layer 112c may be omitted.

For example, the first and second metal layers 111a and 112a may be provided as a Cu layer. Also, the third and fourth metal layers 111b and 112b may be provided as a Cu layer or a Ni layer. Also, the fifth and sixth metal layers 111c and 112c may comprise at least one of a Ni layer, a Ag layer, a Au layer, and the like.

Each of the first, second, third, fourth, fifth, and sixth metal layers 111a, 112a, 111b, 112b, 111c, and 112c may be a single layer or multiple layers. In addition, each of the first, second, third, fourth, fifth, and sixth metal layers 111a, 112a, 111b, 112b, 111 c, and 112c may be formed of a single material or an alloy.

The third and fourth metal layers 111b and 112b may reduce the sizes of the openings provided by the first and second metal layers 111a and 111b. In addition, the fifth and sixth metal layers 111c and 112c may provide a function of reflecting light provided from the light emitting device 120.

When the sizes of the openings provided by the first and second metal layers 111a and 111b are larger than the sizes of the first and second bonding parts 121 and 122, light provided from the light emitting device 120 can be incident on the openings provided by the first and second metal layers 111a and 111b.

At this time, when the openings provided by the first and second metal layers 111a and 111b are provided as a void space or filled with a transparent material, the light provided from the light emitting device 120 may be emitted downward through the openings provided by the first and second metal layers 111a and 111b. Also, when the opening provided by the first and second metal layers 111a and 111b is filled with a non-reflective material, the light provided from the light emitting device 120 may be absorbed by the non-reflective material provided in the opening.

When the sizes of the openings provided by the first and second metal layers 111a and 111b are larger than the sizes of the first and second bonding parts 121 and 122, the extraction efficiency of the light emitting device package can be lowered.

However, according to the embodiment, the sizes of the first and second openings TH1 and TH2 may be adjusted by the third, fourth, fifth, and sixth metal layers 111b, 112b, 111c, and 112c to be provided smaller than the size of the first and second bonding parts 121 and 122. In addition, since the light provided from the light emitting device 120 can be reflected upward by the fifth and sixth metal layers 111c and 112c, the light extraction efficiency can be improved.

In the process of forming the openings in the first and second frames 111 and 112, for example, a punching process or the like may be used. At this time, when the opening is formed through the punching process, the diameter of the opening may be provided by several hundreds of micrometers.

Here, it will be explained again later, depending on the type of the light emitting device 120 applied to the light emitting device package 100 of the embodiment, the widths or diameters of the first and second bonding parts 121 and 122 may be provided several tens of micrometers to several hundreds of micrometers.

According to the light emitting device package 100 of the embodiment, for the large opening formed through a punching process or the like, it is possible to provide the first and second openings TH1 and TH2 having a smaller size than the width or diameter of the first and second bonding parts 121 and 122 through at least one of the third, fourth, fifth, and sixth metal layers 111b, 112b, 111c, and 112c.

For example, according to the embodiment, when the widths or diameters of the first and second bonding parts 121 and 122 are several tens of micrometers, it is possible to provide the first and second openings TH1 and TH2 having a smaller size than the width or diameter of the first and second bonding parts 121 and 122 by forming at least one of the third, fourth, fifth, and sixth metal layers 111b, 112b, 111c, and 112c.

In addition, when at least one of the third, fourth, fifth, and sixth metal layers 111b, 112b, 111c, and 112c comprises a Ni layer, the Ni layer has a small change in thermal expansion, so that even when the size or placement of the package body by thermal expansion is changed, the position of the light emitting device 120 disposed on the upper portion can be stably fixed by the Ni layer. When the fifth and sixth metal layers 111c and 112c comprise a Ag layer, the Ag layer can efficiently reflect light emitted from the light emitting device disposed in the upper portion and improve light intensity.

The width W3 between the first opening TH1 and the second opening TH2 in the lower surface region of the first frame 111 and the second frame 112 may be provided several hundreds of micrometers. The width W3 between the first opening TH1 and the second opening TH2 in the lower surface region of the first frame 111 and the second frame 112 may be provided, for example, 100 micrometers to 150 micrometers.

The width W3 between the first opening TH1 and the second opening TH2 in the lower surface region of the first frame 111 and the second frame 112 may be selected to be provided larger than a certain distance in order to prevent electric short between the pads when the light emitting device package 100 of the embodiment is later mounted on a circuit board, a submount, or the like.

The light emitting device package 100 according to the embodiment may comprise a first resin 130.

The first resin 130 may be disposed between the body 113 and the light emitting device 120. The first resin 130 may be disposed between the upper surface of the body 113 and the lower surface of the light emitting device 120.

In addition, the light emitting device package 100 according to the embodiment may comprise a recess R, as shown in FIGS. 1 to 3.

The recesses R may be provided in the body 113. The recess R may be provided between the first opening TH1 and the second opening TH2. The recess R may be provided to be recessed toward a lower surface from an upper surface of the body 113. The recess R may be disposed under the light emitting device 120. The recess R may be provided to overlap with the light emitting device 120 in the first direction.

For example, the first resin 130 may be disposed in the recess R. The first resin 130 may be disposed between the light emitting device 120 and the body 113. The first resin 130 may be disposed between the first bonding part 121 and the second bonding part 122. For example, the first resin 130 may be disposed in contact with a side surface of the first bonding part 121 and a side surface of the second bonding part 122.

The first resin 130 may comprise an adhesive function. The first resin 130 may provide an adhesive force to neighboring components. The first resin 130 may be referred to as an adhesive.

The first resin 130 may provide a stable fixing force between the light emitting device 120 and the package body 110. The first resin 130 may provide a stable fixing force between the light emitting device 120 and the body 113. The first resin 130 may be disposed in direct contact with the upper surface of the body 113, for example. In addition, the first resin 130 may be disposed in direct contact with the lower surface of the light emitting device 120.

For example, the first resin 130 may comprise at least one of an epoxy-based material, a silicone-based material, a hybrid material including an epoxy-based material and a silicone-based material. Also, as an example, when the first resin 130 comprises a reflective function, the adhesive may comprise a white silicone.

The first resin 130 may provide a stable fixing force between the body 113 and the light emitting device 120, when the light is emitted to the lower surface of the light emitting device 120, and the first resin may provide a light diffusing function between the light emitting device 120 and the body 113. When the light is emitted from the light emitting device 120 to the lower surface of the light emitting device 120, the first resin 130 provides a light diffusion function to improve the light extraction efficiency of the light emitting device package 100. In addition, the first resin 130 may reflect light emitted from the light emitting device 120. When the first resin 130 comprises a reflection function, the first resin 130 may be formed of a material including $TiO_2$, $SiO_2$, and the like.

According to the embodiment, the depth T1 of the recess R may be provided smaller than the depth T2 of the first opening TH1 or the depth T2 of the second opening TH2.

The depth T1 of the recess R may be determined in consideration of the adhesive force of the first resin 130. In addition, the depth T1 of the recess R may be determined by considering the stable strength of the body and/or so as to prevent cracks in the light emitting device package 100 by the heat emitted from the light emitting device 120.

The recess R may provide an appropriate space in which a kind of under fill process may be performed under the light emitting device 120. Here, the under fill process may be a process of disposing the first resin 130 under the light emitting device 120 after mounting the light emitting device 120 on the package body 110, or the under fill process may be a process of disposing the first resin 130 in the recess and then disposing the light emitting device 120 in order to mount the light emitting device 120 through the first resin 130 in the process of mounting the light emitting device 120 on the package body 110. The recess R may be provided larger than or equal to a first depth so that the first resin 130 can be sufficiently provided between the lower surface of the light emitting device 120 and the upper surface of the body 113. In addition, the recess R may be provided smaller than or equal to a second depth to provide stable strength of the body 113.

The depth T1 and the width W4 of the recess R can affect the forming position and fixing force of the first resin 130. The depth T1 and the width W4 of the recess R may be determined so that sufficient fixing force can be provided by the first resin 130 disposed between the body 113 and the light emitting device 120.

For example, the depth T1 of the recess R may be provided by several tens of micrometers. The depth T1 of the recess R may be provided in a range of 40 micrometers to 60 micrometers.

In addition, the width W4 of the recess R may be several tens of micrometers to several hundreds of micrometers. Here, the width W4 of the recess R may be provided in the major axis direction of the light emitting device 120.

The width W4 of the recess R may be provided narrower than the gap between the first bonding part 121 and the second bonding part 122. The width W4 of the recess R may be provided in a range of 140 micrometers to 160 micrometers. For example, the width W4 of the recess R may be provided at 150 micrometers.

The depth T2 of the first opening TH1 may be provided corresponding to the thickness of the first frame 111. The depth T2 of the first opening TH1 may be provided with a thickness capable of maintaining stable strength of the first frame 111.

The depth T2 of the second opening TH2 may be provided corresponding to the thickness of the second frame 112. The depth T2 of the second opening TH2 may be provided with a thickness capable of maintaining stable strength of the second frame 112.

The depth T2 of the first opening TH1 and the depth T2 of the second opening TH2 may be provided corresponding to the thickness of the body 113. The depth T2 of the first opening TH1 and the depth T2 of the second opening TH2 may be provided with a thickness capable of maintaining stable strength of the body 113.

For example, the depth T2 of the first opening TH1 may be provided several hundreds of micrometers. The depth T2 of the first opening TH1 may be provided with 180 micrometers to 220 micrometers. For example, the depth T2 of the first opening TH1 may be provided with 200 micrometers.

For example, the thickness of (T2−T1) may be selected to be at least 100 micrometers or more. This is in consideration of the thickness of the injection process capable of providing crack free of the body 113.

According to the embodiment, a ratio (T2/T1) of the T1 thickness and the T2 thickness may be provided in a range of 2 to 10. As an example, when the thickness of T2 is provided in 200 micrometers, the thickness of T1 may be provided in a range of 20 micrometers to 100 micrometers.

In addition, the light emitting device package 100 according to the embodiment may comprise a molding part 140, as shown in FIGS. 1 to 3.

The molding part 140 may be provided on the light emitting device 120. The molding part 140 may be disposed on the first and second frames 111 and 112. The molding part 140 may be disposed in the cavity C provided by the package body 110.

The molding part 140 may comprise an insulating material. Also, the molding part 140 may comprise wavelength conversion means for receiving light emitted from the light emitting device 120 and providing wavelength-converted light. For example, the molding part 140 may comprise at least one selected from a group including phosphors, quantum dots, and the like.

The light emitting device package 100 according to the embodiment may comprise a first conductor 221 and a second conductor 222, as shown in FIGS. 1 to 4. In addition, the light emitting device package 100 according to the embodiment may comprise a first conductive layer 321 and a second conductive layer 322. The first conductive layer 321 may be spaced apart from the second conductive layer 322.

The first conductor 221 may be disposed under the first bonding part 121. The first conductor 221 may be electrically connected to the first bonding part 121. The first conductor 221 may be disposed to overlap with the first bonding part 121 in the first direction.

The first conductor 221 may be provided in the first opening TH1. The first conductor 221 may be disposed between the first bonding part 121 and the first conductive layer 321. The first conductor 221 may be electrically connected to the first bonding part 121 and the first conductive layer 321.

The lower surface of the first conductor 221 may be disposed lower than the upper surface of the first opening TH1. The lower surface of the first conductor 221 may be disposed lower than the upper surface of the first conductive layer 321.

The first conductor 221 may be disposed on the first opening TH1. In addition, the first conductor 221 may extend from the first bonding part 121 into the inside of the first opening TH1.

In addition, the second conductor 222 may be disposed under the second bonding part 122. The second conductor 222 may be electrically connected to the second bonding part 122. The second conductor 222 may be disposed to overlap with the second bonding part 122 in the first direction.

The second conductor 222 may be provided in the second opening TH2. The second conductor 222 may be disposed between the second bonding part 122 and the second conductive layer 322. The second conductor 222 may be electrically connected to the second bonding part 122 and the second conductive layer 322.

The lower surface of the second conductor 222 may be disposed lower than the upper surface of the second opening TH2. The lower surface of the second conductor 222 may be disposed lower than the upper surface of the second conductive layer 322.

The second conductor 222 may be disposed on the second opening TH2. The second conductor 222 may extend from the second bonding part 122 into the inside of the second opening TH2.

According to the embodiment, the first conductive layer 321 may be disposed on a lower surface and a side surface of the first conductor 221. The first conductive layer 321 may be disposed in direct contact with the lower surface and the side surface of the first conductor 221. The lower surface of the first conductive layer 321 may have a concave shape from the lower portion to the upper portion.

In addition, according to the embodiment, the second conductive layer 322 may be disposed on a lower surface and a side surface of the second conductor 222. The second conductive layer 322 may be disposed in direct contact with the lower surface and the side surface of the second conductor 222. The lower surface of the second conductive layer 322 may have a concave shape from the lower portion to the upper portion.

The first conductive layer 321 may be provided in the first opening TH1. The first conductive layer 321 may be disposed under the first bonding part 121. The width of the first conductive layer 321 may be provided smaller than the width of the first bonding part 121.

According to the light emitting device package of the embodiment, the electrical connection between the first conductive layer 321 and the first bonding part 121 can be more stably provided by the first conductor 221.

The first bonding part 121 may have a width in a second direction perpendicular to the first direction in which the first opening TH1 is formed. The width of the first bonding part 121 may be provided greater than the width of the first opening TH1 in the second direction.

The first conductive layer 321 may be disposed in direct contact with the lower surface of the first bonding part 121. The first conductive layer 321 may be electrically connected to the first bonding part 121. The first conductive layer 321 may be surrounded by the first frame 111. The lower surface of the first conductive layer 321 may have a concave shape from the lower portion to the upper portion.

The second conductive layer 322 may be provided in the second opening TH2. The second conductive layer 322 may be disposed under the second bonding part 122. The width of the second conductive layer 322 may be provided smaller than the width of the second bonding part 122.

According to the light emitting device package 200 of the embodiment, the electrical connection between the second conductive layer 322 and the second bonding part 122 can be more stably provided by the second conductor 222.

The second bonding part 122 may have a width in a second direction perpendicular to the first direction in which the second opening TH2 is formed. The width of the second bonding part 122 may be provided greater than the width of the second opening TH2 in the second direction.

The second conductive layer 322 may be disposed in direct contact with the lower surface of the second bonding part 122. The second conductive layer 322 may be electrically connected to the second bonding part 122. The second conductive layer 322 may be disposed so as to be surrounded by the second frame 112. The lower surface of the second conductive layer 322 may have a concave shape from the lower portion to the upper portion.

For example, the first and second conductors 221 and 222 may be stably bonded to the first and second bonding parts 121 and 122 through additional bonding materials, respectively. The side surfaces and the lower surfaces of the first and second conductors 221 and 222 may be in contact with the first and second conductive layers 321 and 322, respectively.

Therefore, compared to the case where the first and second conductive layers 321 and 322 directly contact the lower surfaces of the first and second bonding parts 121 and 122, respectively, the areas in which the first and second conductive layers 321 and 322 contact the first and second conductors 221 and 222, respectively, can be larger. Accordingly, power can be stably supplied to the first and second bonding parts 121 and 122 from the first and second conductive layers 321 and 322 through the first and second conductors 221 and 222, respectively.

The first conductive layer 321 and the second conductive layer 322 may comprise a material selected from a group including Ag, Au, Pt, Sn, Cu, and the like, or an alloy thereof. However, it is not limited thereto, and the first conductive layer 321 and the second conductive layer 322 may be formed of a material capable of ensuring a conductive function.

For example, the first conductive layer 321 and the second conductive layer 322 may be formed using a conductive paste. The conductive paste may comprise a solder paste, a silver paste, or the like, and may be composed of a multi-layer composed of different materials, or a multi-layer or a single layer composed of an alloy. For example, the first conductive layer 321 and the second conductive layer 322 may comprise a SAC (Sn—Ag—Cu) material.

According to the embodiment, in the process of forming the first and second conductive layers 321 and 322 or the post-heat treatment process in which the first and second conductive layers 321 and 322 are provided, an intermetallic compound (IMC) layer may be formed between the first and second conductive layers 321 and 322 and the first and second frames 111 and 112.

For example, an intermetallic compound layer can be formed by bonding between a material of the first and second conductive layers 321 and 322 and the first, second, third, fourth, fifth, and sixth metal layers 111a, 112a, 111b, 112b, 111c, and 112c of the first and second frames 111 and 112.

Accordingly, the first and second conductive layers 321 and 322 and the first and second frames 111 and 112 can be physically and electrically coupled to each other stably.

For example, the intermetallic compound layer may comprise at least one metal layer selected from a group including AgSn, CuSn, AuSn, and the like. The intermetallic compound layer may be formed by a coupling of a first material and a second material, and a first material may be provided from the first and second conductive layers 321 and 322, and a second material may be provided from at least one metal layer of the first, second, third, fourth, fifth, and sixth metal layers 111a, 112a, 111b, 112b, 111c, and 112c.

According to the embodiment, the intermetallic compound layer may be provided with a thickness of several micrometers. For example, the intermetallic compound layer may be formed to have a thickness in a range of 1 micrometer to 3 micrometers.

When the first and second conductive layers 321 and 322 comprise a Sn material and the fifth and sixth metal layers 111c and 112c comprise a Ag material, an intermetallic compound layer of AgSn may be formed by a coupling of the Sn material and the Ag material, in the process of providing the first and second conductive layers 321 and 322 or the post-heat treatment process in which the first and second conductive layers 321 and 322 are provided.

In addition, when the first and second conductive layers 321 and 322 comprise a Sn material and the fifth and sixth metal layers 111c and 112c comprise a Au material, an intermetallic compound layer of AuSn may be formed by a coupling of the Sn material and the Au material, in the process of providing the first and second conductive layers 321 and 322 or the post-heat treatment process in which the first and second conductive layers 321 and 322 are provided.

In addition, when the first and second conductive layers 321 and 322 comprise a Sn material and the third and fourth metal layers 111b and 112b comprise a Cu material, an intermetallic compound layer of CuSn may be formed by a coupling of the Sn material and the Cu material, in the process of providing the first and second conductive layers 321 and 322 or the post-heat treatment process in which the first and second conductive layers 321 and 322 are provided.

In addition, when the first and second conductive layers 321 and 322 comprise a Ag material and at least one of the first, second, third, fourth, fifth, and sixth metal layers 111a, 112a, 111b, 112b, 111c, and 112c comprises a Sn material, an intermetallic compound layer of AgSn may be formed by a coupling of the Ag material and the Sn material, in the process of providing the first and second conductive layers 321 and 322 or the post-heat treatment process in which the first and second conductive layers 321 and 322 are provided.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package 100 according to the embodiment is bonded to a main board or the like through a reflow process, re-melting phenomenon does not occur, so there are advantages that electrical connection and physical bonding force are not deteriorated.

In addition, according to the light emitting device package 100 and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC).

Meanwhile, according to the embodiment, an intermetallic compound layer may also be formed between the first and second bonding parts 121 and 122 and the first and second conductive layers 321 and 322.

As described above, according to the embodiment, in the process of forming the first and second conductive layers 321 and 322, or the post-heat treatment process in which the first and second conductive layers 321 and 322 are provided, an intermetallic compound (IMC) layer may be formed between the first and second conductive layers 321 and 322 and the first and second bonding parts 121 and 122.

For example, an alloy layer may be formed by bonding between a material of the first and second conductive layers 321 and 322 and the first and second bonding parts 121 and 122.

Accordingly, the first conductive layer 321 and the first bonding part 121 can be physically and electrically coupled more stably. The first conductive layer 321, the alloy layer, and the first bonding part 121 can be physically and electrically coupled stably.

In addition, the second conductive layer 322 and the second bonding part 122 can be physically and electrically coupled more stably. The second conductive layer 322, the alloy layer, and the second bonding part 122 can be physically and electrically coupled stably.

For example, the alloy layer may comprise at least one intermetallic compound layer selected from a group including AgSn, CuSn, AuSn, and the like. The intermetallic compound layer may be formed by a coupling of a first material and a second material, and the first material may be provided from the first and second conductive layers 321 and 322, and the second material may be provided from the second bonding parts 121 and 122.

According to the embodiment, the intermetallic compound layer may be provided with a thickness of several micrometers. For example, the intermetallic compound layer may be formed to have a thickness in a range of 1 micrometer to 3 micrometers.

When the first and second conductive layers 321 and 322 comprise a Sn material and the first and second bonding parts 121 and 122 comprise a Ag material, an intermetallic compound layer of AgSn may be formed by a coupling of the Sn material and the Ag material, in the process of providing the first and second conductive layers 321 and 322 or the post-heat treatment process in which the first and second conductive layers 321 and 322 are provided.

In addition, when the first and second conductive layers 321 and 322 comprise a Sn material and the first and second bonding parts 121 and 122 comprise a Au material, an intermetallic compound layer of AuSn may be formed by a coupling of the Sn material and the Au material, in the process of providing the first and second conductive layers 321 and 322 or the post-heat treatment process in which the first and second conductive layers 321 and 322 are provided.

In addition, when the first and second conductive layers 321 and 322 comprise a Ag material and the first and second bonding parts 121 and 122 comprise a Sn material, an intermetallic compound layer of AgSn may be formed by a coupling of the Ag material and the Sn material, in the process of providing the first and second conductive layers 321 and 322 or the post-heat treatment process in which the first and second conductive layers 321 and 322 are provided.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package 100 according to the embodiment is bonded to a main board or the like through a reflow process, re-melting phenomenon does not occur, so there are advantages that electrical connection and physical bonding force are not deteriorated.

Meanwhile, according to the embodiment, an intermetallic compound layer may also be formed between the first and second conductors 221 and 222 and the first and second conductive layers 321 and 322.

As described above, according to the embodiment, in the process of forming the first and second conductive layers 321 and 322, or the post-heat treatment process in which the first and second conductive layers 321 and 322 are provided, an intermetallic compound (IMC) layer may be formed between the first and second conductive layers 321 and 322 and the first and second conductors 221 and 222.

For example, an alloy layer may be formed by bonding between a material of the first and second conductive layers 321 and 322 and the first and second conductors 221 and 222.

Accordingly, the first conductive layer 321 and the first conductor 221 can be physically and electrically coupled more stably. The first conductive layer 321, the alloy layer, and the first conductor 221 can be physically and electrically coupled stably.

In addition, the second conductive layer 322 and the second conductive body 222 can be physically and electrically coupled more stably. The second conductive layer 322, the alloy layer, and the second conductor 222 can be physically and electrically coupled stably.

For example, the alloy layer may comprise at least one intermetallic compound layer selected from a group including AgSn, CuSn, AuSn, and the like. The intermetallic compound layer may be formed by a coupling of a first material and a second material, and the first material may be provided from the first and second conductive layers 321 and 322, and the second material may be provided from the first and second conductors 221 and 222.

According to the embodiment, the intermetallic compound layer may be provided with a thickness of several micrometers. For example, the intermetallic compound layer may be formed to have a thickness in a range of 1 micrometer to 3 micrometers.

When the first and second conductive layers 321 and 322 comprise a Sn material and the first and second conductors 221 and 222 comprise a Ag material, an intermetallic compound layer of AgSn may be formed by a coupling of the Sn material and the Ag material, in the process of providing the first and second conductive layers 321 and 322 or the post-heat treatment process in which the first and second conductive layers 321 and 322 are provided.

In addition, when the first and second conductive layers 321 and 322 comprise a Sn material and the first and second conductors 221 and 222 comprise a Au material, an intermetallic compound layer of AuSn may be formed by a coupling of the Sn material and the Au material, in the process of providing the first and second conductive layers 321 and 322 or the post-heat treatment process in which the first and second conductive layers 321 and 322 are provided.

In addition, when the first and second conductive layers 321 and 322 comprise a Ag material and the first and second conductors 221 and 222 comprise a Sn material, an intermetallic compound layer of AgSn may be formed by a coupling of the Ag material and the Sn material, in the process of providing the first and second conductive layers 321 and 322 or the post-heat treatment process in which the first and second conductive layers 321 and 322 are provided.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package 100 according to the embodiment is bonded to a main board or the like through a reflow process, re-melting phenomenon does not occur, so there are advantages that electrical connection and physical bonding force are not deteriorated.

In addition, as shown in FIGS. 1 to 3, the light emitting device package 100 according to the embodiment may comprise a first lower recess R11 and a second lower recess R12. The first lower recess R11 and the second lower recess R12 may be spaced apart from each other.

The first lower recess R11 may be provided on a lower surface of the first frame 111. The first lower recess R11 may be provided to be concaved from the lower surface toward the upper surface of the first frame 111. The first lower recess R11 may be spaced apart from the first opening TH1.

The first lower recess R11 may be provided with a width in a range of several micrometers to several tens of micrometers. A resin part may be provided in the first lower recess R11. The resin part filled in the first lower recess R11 may be provided with the same material as the body 113, for example.

However, it is not limited thereto, and the resin part may be selected from materials having poor adhesive force and wettability with the first and second conductive layers 321 and 322. Alternatively, the resin part may be selected and provided from materials having a low surface tension with respect to the first and second conductive layers 321 and 322.

For example, the resin part filled in the first lower recess R11 may be provided in the process of forming the first frame 111, the second frame 112, and the body 113 through an injection process or the like.

The resin part filled in the first lower recess R11 may be disposed around the lower surface region of the first frame 111 providing the first opening TH1. The lower surface area of the first frame 111 providing the first opening TH1 may be disposed as a kind of an island in a shape separated from an adjacent lower surface forming the first frame 111.

For example, as shown in FIG. 2, the lower surface area of the first frame 111 providing the first opening TH1 may be isolated from the adjacent first frame 111 by the resin part filled in the first lower recess R11 and the body 113.

Accordingly, when the resin part is disposed of a material having poor adhesion and wettability with the first and second conductive layers 321 and 322, or a material having a low surface tension between the resin part and the first and second conductive layers 321 and 322, it can be prevented that the first conductive layer 321 provided in the first opening TH1 is moved from the first opening TH1 and spreads beyond the resin part filled in the first lower recess R11 or the body 113.

This is because the adhesion between the first conductive layer 321, and the resin part and the body 113, or the wettability, surface tension and the like between the resin part and the first and second conductive layers 321 and 322 are not good. That is, the material forming the first conductive layer 321 may be selected to have good adhesive properties with the first frame 111. In addition, the material forming the first conductive layer 321 may be selected to have poor adhesive properties with the resin part and the body 113.

Therefore, it can be prevented that the first conductive layer 321 overflows or spreads out of the region where the resin part or body 113 is provided by overflowing from the first opening TH1 toward the region where the resin part or the body 113 is provided, and the first conductive layer 321 can be stably disposed in an area where the first opening TH1 is provided.

When the first conductive layer 321 disposed in the first opening TH1 overflows, the first conductive layer 321 may be prevented from expanding to the outer region of the first lower recess R11 provided with the resin part or the body 113. In addition, the first conductive layer 321 can be stably connected to the lower surface of the first bonding part 121 in the first opening TH1.

Therefore, when the light emitting device package is mounted on a circuit board, the first conductive layer 321 and the second conductive layer 322 can be prevented from being in contact with each other to be short-circuited, and the amount of the first and second conductive layers 321 and 322 can be very easily controlled in a disposing process of the first and second conductive layers 321 and 322.

In addition, the second lower recess R12 may be provided on a lower surface of the second frame 112. The second lower recess R12 may be provided to be concaved from the lower surface toward the upper surface of the second frame 112. The second lower recess R12 may be spaced apart from the second opening TH2.

The second lower recess R12 may be provided with a width in a range of several micrometers to tens of micrometers. A resin part may be provided in the second lower recess R12. The resin part filled in the second lower recess R12 may be provided with the same material as the body 113, for example.

However, it is not limited thereto, and the resin part may be selected from materials having poor adhesive force and wettability with the first and second conductive layers 321 and 322. Alternatively, the resin part may be selected and provided from materials having a low surface tension with respect to the first and second conductive layers 321 and 322.

For example, a resin part filled in the second lower recess R12 may be provided in the process of forming the first frame 111, the second frame 112, and the body 113 through an injection process or the like.

A resin part filled in the second lower recess R12 may be disposed around a lower surface region of the second frame 112 providing the second opening TH2. The lower surface area of the second frame 112 providing the second opening TH2 may be disposed as a kind of an island in a shape separated from an adjacent lower surface forming the second frame 112.

For example, as shown in FIG. 2, the lower surface area of the second frame 112 providing the second opening TH2 may be isolated from the adjacent second frame 112 by the resin part filled in the second lower recess R12 and the body 113.

Accordingly, when the resin part is disposed of a material having poor adhesion and wettability with the first and second conductive layers 321 and 322, or a material having a low surface tension between the resin part and the first and second conductive layers 321 and 322, it can be prevented that the second conductive layer 322 provided in the second opening TH2 is moved from the second opening TH2 and spreads beyond the resin part filled in the second lower recess R12 or the body 113.

This is because the adhesion between the second conductive layer 322, and the resin part and the body 113, or the wettability, surface tension and the like between the resin part and the first and second conductive layers 321 and 322 are not good. That is, the material forming the second conductive layer 322 may be selected to have good adhesive properties with the second frame 112. In addition, the material forming the second conductive layer 322 may be selected to have poor adhesive properties with the resin part and the body 113.

Therefore, it can be prevented that the second conductive layer 322 overflows or spreads out of the region where the resin part or body 113 is provided by overflowing from the second opening TH2 toward the region where the resin part or the body 113 is provided, and the second conductive layer 322 can be stably disposed in an area where the second opening TH2 is provided.

When the second conductive layer 322 disposed in the second opening TH2 overflows, the second conductive layer 322 may be prevented from expanding to the outer region of the second lower recess R12 provided with the resin part or the body 113. In addition, the second conductive layer 321 can be stably connected to the lower surface of the second bonding part 122 in the second opening TH2.

Therefore, when the light emitting device package is mounted on a circuit board, the first conductive layer 321 and the second conductive layer 322 can be prevented from being in contact with each other to be short-circuited, and the amount of the first and second conductive layers 321 and 322 can be very easily controlled in a disposing process of the first and second conductive layers 321 and 322.

Meanwhile, according to the light emitting device package 100 of the embodiment, as shown in FIG. 3, the first resin 130 provided on the recess R may be provided between the lower surface of the light emitting device 120 and the upper surfaces of the package body 110. The first resin 130 may be provided around the first and second bonding parts 121 and 122 when viewed from the above the light emitting device 120. In addition, the first resin 130 may be provided around the first and second openings TH1 and TH2 when viewed from above the light emitting device 120.

The first resin 130 may function to stably fix the light emitting device 120 to the package body 110. Also, the first resin 130 may be disposed around the first and second bonding parts 121 and 122 in contact with the side surfaces of the first and second bonding parts 121 and 122.

The first resin 130 may seal the periphery of the first and second bonding parts 121 and 122. The first resin 130 may prevent the first conductive layer 321 and the second conductive layer 322 from diffusing and moving outside the first opening TH1 region and the second opening TH2 region in the direction of the outer surface of the light emitting device 120. When the first and second conductive layers 321 and 322 diffuse and move in the direction of the outer surface of the light emitting device 120, the first and second conductive layers 321 and 322 may contact the active layer of the light emitting device 120, thereby causing defects due to short circuit. Accordingly, when the first resin 130 is disposed, short circuit caused by the first and second conductive layers 321 and 322 and the active layer can be prevented, thereby improving the reliability of the light emitting device package according to the embodiment.

In addition, the first resin 130 can prevent the first conductive layer 321 and the second conductive layer 322 from being diffused toward the recess R under the lower surface of the light emitting device 120 beyond the first opening TH1 region and the second opening TH2 region. Accordingly, it is possible to prevent the first conductive layer 321 and the second conductive layer 322 from being electrically shorted under the light emitting device 120.

Also, according to an embodiment, the light emitting structure 123 may be provided as a compound semiconductor. The light emitting structure 123 may be provided as, for example, Group II-VI or Group III-V compound semiconductors. For example, the light emitting structure 123 may comprise at least two elements selected from aluminum (Al), gallium (Ga), indium (In), phosphorus (P), arsenic (As), and nitrogen (N).

The light emitting structure 123 may comprise a first conductivity type semiconductor layer, an active layer, and a second conductivity type semiconductor layer.

The first and second conductivity type semiconductor layers may be implemented as at least one of Group III-V or Group II-VI compound semiconductors. For example, each of the first and second conductivity type semiconductor layers may comprise a semiconductor material having a compositional formula of $In_xAl_yGa_{1-x-y}N$ ($0 \le x \le 1$, $0 \le y \le 1$, $0 \le x+y \le 1$). For example, each of the first and second conductivity type semiconductor layers may comprise at least one selected from a group including GaN, AlN, AlGaN, InGaN, InN, InAlGaN, AlInN, AlGaAs, GaP, GaAs, GaAsP, AlGaInP, and the like. The first conductivity type semiconductor layer may be an n-type semiconductor layer that is doped with an N-type dopant such as Si, Ge, Sn, Se, Te, and the like. The second conductivity type semiconductor layer may be a p-type semiconductor layer that is doped with a p-type dopant such as Mg, Zn, Ca, Sr, Ba, and the like.

The active layer may be formed of a compound semiconductor. For example, the active layer may be formed of at least one of Group III-V or Groups II-VI compound semiconductors. When the active layer has a multi-well structure, the active layer may comprise a plurality of well layers and a plurality of barrier layers, which are alternately arranged and may be formed of a material having a compositional formula of $In_xAl_yGa_{1-x-y}N$ ($0 \le x \le 1$, $0 \le y \le 1$). For example, the active layer may comprise at least one selected from a group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, InP/GaAs, and the like.

In the light emitting device package 100 according to the embodiment, power may be connected to the first bonding part 121 through the first opening TH1 region, and connected to the second bonding part 121 through the second opening TH2 region.

Accordingly, the light emitting device 120 can be driven by the driving power supplied through the first bonding part 121 and the second bonding part 122. The light emitted from the light emitting device 120 may be provided in an upward direction of the package body 110.

Meanwhile, the light emitting device package 100 according to the embodiment described above may be mounted on a submount, a circuit board, or the like and provided.

However, when the light emitting device package is mounted on the submount or the circuit board, a high temperature process such as a reflow process or the like may be applied. Here, in the reflow process, a re-melting phenomenon occurs in a bonding area between the lead frame and the light emitting device provided in the light emitting device package to deteriorate the stability of the electrical connection and the physical coupling.

However, according to the light emitting device package and the method of manufacturing the light emitting device package of the embodiment, the bonding part of the light emitting device according to the embodiment can receive the driving power through the conductive layer disposed in the opening. The melting point of the conductive layer disposed in the opening and the melting point of the intermetallic compound layer may be selected to have a higher value than the melting point of the common bonding material.

Therefore, even when the light emitting device package 100 according to the embodiment is bonded to a main board through a reflow process, re-melting phenomenon does not occur, so there are advantages that electrical connection and physical bonding force are not deteriorated.

In addition, according to the light emitting device package 100 and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC) resin.

Then, referring to FIGS. 5 to 8, a method of manufacturing a light emitting device package according to an embodiment of the present invention will be described.

In describing a method of manufacturing a light emitting device package of an embodiment of the present invention with reference to FIGS. 5 to 8, descriptions overlapping with those described with reference to FIGS. 1 to 4 may be omitted.

Referring to FIG. 5, a method of manufacturing a light emitting device package according to an embodiment of the present invention may comprise providing a package body 110.

The package body 110 may comprise a first frame 111 and a second frame 112. The first frame 111 and the second frame 112 may be spaced apart from each other.

The package body 110 may comprise a body 113. The body 113 may be disposed between the first frame 111 and the second frame 112.

The body 113 may be disposed on the first frame 111. In addition, the body 113 may be disposed on the second frame 112.

The body 113 may provide an inclined surface disposed on the first frame 111 and the second frame 112. A cavity C may be provided on the first frame 111 and the second frame 112 by the inclined surface of the body 113.

In addition, the first frame 111 may comprise a first opening TH1. The second frame 112 may comprise a second opening TH2.

The first opening TH1 may be provided in the first frame 111. The first opening TH1 may be provided passing through the first frame 111. The first opening TH1 may be provided passing through the upper surface and the lower surface of the first frame 111 in a first direction.

The second opening TH2 may be provided in the second frame 112. The second opening TH2 may be provided passing through the second frame 112. The second opening TH2 may be provided passing through the upper surface and the lower surface of the second frame 112 in a first direction.

Meanwhile, the first and second frames 111 and 112 may comprise a support member and a metal layer surrounding the support member.

According to the embodiment, after an etching process or a punching process for the support member is completed to form the first and second openings TH1 and TH2, a plating process or the like for the support members constituting the first and second frames 111 and 112 may be performed so that the metal layer may be formed. Accordingly, the metal layer may be formed on the surfaces of the support members constituting the first and second frames 111 and 112.

For example, the first frame 111 may comprise a first metal layer 111a, a third metal layer 111b, and a fifth metal layer 111c. In addition, the second frame 112 may comprise a second metal layer 112a, a fourth metal layer 112b, and a sixth metal layer 112c.

The first metal layer 111a and the second metal layer 112a may be referred to as supporting members for forming the first and second frames 111 and 112. The third, fourth, fifth, and sixth metal layers 111b, 112b, 111c, and 112c may be formed through a plating process, for example.

The third metal layer 111b may be disposed on a side surface of the first metal layer 111a. The third metal layer 111b may be disposed between the first metal layer 111a and the first opening TH1.

The fifth metal layer 111c may be disposed on the upper, lower, and side surfaces of the first metal layer 111a. The fifth metal layer 111c may be disposed on the upper, lower, and side surfaces of the third metal layer 111b. The fifth metal layer 111c may be disposed between the side surface of the third metal layer 111b and the first opening TH1.

The fourth metal layer 112b may be disposed on a side surface of the second metal layer 112a. The fourth metal layer 112b may be disposed between the second metal layer 112a and the second opening TH2.

The sixth metal layer 112c may be disposed on the upper, lower, and side surfaces of the second metal layer 112a. The sixth metal layer 112c may be disposed on the upper, lower, and side surfaces of the fourth metal layer 112b. The sixth metal layer 112c may be disposed between the side surface of the fourth metal layer 112b and the second opening TH2.

For example, the first and second metal layers 111a and 112a may be provided as a Cu layer. Also, the third and fourth metal layers 111b and 112b may be provided as a Cu layer or a Ni layer. Also, the fifth and sixth metal layers 111c and 112c may comprise at least one of a Ni layer, a Ag layer, a Au layer, and the like.

Each of the first, second, third, fourth, fifth, and sixth metal layers 111a, 112a, 111b, 112b, 111c, and 112c may be a single layer or multiple layers. In addition, each of the first, second, third, fourth, fifth, and sixth metal layers 111a, 112a, 111b, 112b, 111 c, and 112c may be formed of a single material or an alloy.

In addition, the package body 110 may comprise a recess R provided in the body 113.

The recesses R may be provided in the body 113. The recess R may be provided between the first opening TH1 and the second opening TH2. The recess R may be recessed from an upper surface toward a lower surface of the body 113.

In addition, the light emitting device package 100 according to the embodiment may comprise a first lower recess R11 and a second lower recess R12, as shown in FIG. 5. The first lower recess R11 and the second lower recess R12 may be spaced apart from each other.

The first lower recess R11 may be provided on a lower surface of the first frame 111. The first lower recess R11 may be recessed from the lower surface toward the upper surface of the first frame 111. The first lower recess R11 may be spaced apart from the first opening TH1.

The first lower recess R11 may be provided with a width in a range of several micrometers to several tens of micrometers. A resin part may be provided in the first lower recess R11. The resin part filled in the first lower recess R11 may be provided with the same material as the body 113, for example.

For example, the resin part filled in the first lower recess R11 may be provided in the process of forming the first frame 111, the second frame 112, and the body 113 through an injection process or the like.

The resin part filled in the first lower recess R11 may be disposed around the lower surface region of the first frame 111 providing the first opening TH1. The lower surface area of the first frame 111 providing the first opening TH1 may be disposed as a kind of an island in a shape separated from an adjacent lower surface forming the first frame 111.

In addition, the second lower recess R12 may be provided on a lower surface of the second frame 112. The second lower recess R12 may be provided to be concaved from the lower surface toward the upper surface of the second frame 112. The second lower recess R12 may be spaced apart from the second opening TH2.

The second lower recess R12 may be provided with a width in a range of several micrometers to tens of micrometers. A resin part may be provided in the second lower recess R12. The resin part filled in the second lower recess R12 may be provided with the same material as the body 113, for example.

For example, a resin part filled in the second lower recess R12 may be provided in the process of forming the first frame 111, the second frame 112, and the body 113 through an injection process or the like.

A resin part filled in the second lower recess R12 may be disposed around a lower surface region of the second frame 112 providing the second opening TH2. The lower surface area of the second frame 112 providing the second opening TH2 may be disposed as a kind of an island in a shape separated from an adjacent lower surface forming the second frame 112.

Next, according to the method of manufacturing the light emitting device package of the embodiment, a first resin 130 may be provided in the recess R as shown in FIG. 6.

The first resin 130 may be provided to the region of recess R through a dotting method or the like. For example, the first resin 130 may be provided in a region where the recess R is formed, and may be provided to overflow the recess R.

In addition, according to the method of manufacturing the light emitting device package, as shown in FIG. 7, the light emitting device 120 may be provided on the package body 110.

According to the embodiment, the recess R may be used as an align key in the process of disposing the light emitting device 120 on the package body 110.

The light emitting device 120 may be fixed to the body 113 by the first resin 130. A portion of the first resin 130 provided in the recess R may be moved toward the first bonding part 121 and the second bonding part 122 of the light emitting device 120 and cured. The first resin 130 may seal the periphery of the first and second bonding parts 121 and 122.

Accordingly, the first resin 130 may be provided in a wide area between the lower surface of the light emitting device 120 and the upper surface of the body 113, thereby the fixing force between the light emitting device 120 and the body 113 can be improved.

According to the embodiment, the first opening TH1 may be disposed under the first bonding part 121 of the light emitting device 120. The first opening TH1 may be provided to overlap with the first bonding part 121 of the light emitting device 120. The first opening TH1 may be provided to overlap with the first bonding part 121 of the light emitting device 120 in a first direction toward the lower surface from the upper surface of the first frame 111.

The second opening TH2 may be disposed under the second bonding part 122 of the light emitting device 120. The second opening TH2 may be provided to overlap with the second bonding part 122 of the light emitting device 120. The second opening TH2 may be provided to overlap with the second bonding part 122 of the light emitting device 120 in a first direction toward the lower surface from the upper surface of the second frame 112.

In addition, a first conductor 221 may be disposed in the first opening TH1. The first conductor 221 may be disposed under the first bonding part 121. A second conductor 222 may be disposed in the second opening TH2. The second conductor 222 may be disposed under the second bonding part 122.

Next, according to the method of manufacturing the light emitting device package of the embodiment, as shown in FIG. 8, first and second conductive layers 321 and 322, and a molding part 140 may be formed.

In the light emitting device package 100 according to the embodiment, the first bonding part 121 and the first conductor 221 may be exposed through the first opening TH1. Also, the second bonding part 122 and the second conductor 222 may be exposed through the second opening TH2.

According to the embodiment, the first conductive layer 321 may be formed in the first opening TH1. In addition, the second conductive layer 322 may be formed in the second opening TH2.

The first conductive layer 321 may be provided in the first opening TH1. The first conductive layer 321 may be disposed under the first bonding part 121. The width of the first conductive layer 321 may be provided smaller than the width of the first bonding part 121. The first conductive layer 321 may be disposed in direct contact with the lower surface of the first bonding part 121. The first conductive layer 321 may be electrically connected to the first bonding part 121. The first conductive layer 321 may be disposed to be surrounded by the first frame 111.

The second conductive layer 322 may be provided in the second opening TH2. The second conductive layer 322 may be disposed under the second bonding part 122. The width of the second conductive layer 322 may be provided smaller than the width of the second bonding part 122. The second conductive layer 322 may be disposed in direct contact with the lower surface of the second bonding part 122. The second conductive layer 322 may be electrically connected to the second bonding part 122. The second conductive layer 322 may be disposed to be surrounded by the second frame 112.

For example, the first conductive layer 321 and the second conductive layer 322 may be formed using a conductive paste. The first conductive layer 321 and the second conductive layer 322 may be formed of solder paste or silver paste or the like. For example, the first conductive layer 321 and the second conductive layer 322 may comprise a SAC (Sn—Ag—Cu) material.

According to the embodiment, in the process of forming the first and second conductive layers 321 and 322 or the post-heat treatment process in which the first and second conductive layers 321 and 322 are provided, an intermetallic compound (IMC) layer may be formed between the first and second conductive layers 321 and 322 and the first and second frames 111 and 112.

For example, an intermetallic compound layer can be formed by bonding between a material of the first and second conductive layers 321 and 322 and the first, second, third, fourth, fifth, and sixth metal layers 111a, 112a, 111b, 112b, 111c, and 112c of the first and second frames 111 and 112.

Accordingly, the first and second conductive layers 321 and 322 and the first and second frames 111 and 112 can be physically and electrically coupled to each other stably.

For example, the intermetallic compound layer may comprise at least one metal layer selected from a group including AgSn, CuSn, AuSn, and the like. The intermetallic compound layer may be formed by a coupling of a first material and a second material, and a first material may be provided from the first and second conductive layers 321 and 322, and a second material may be provided from at least one metal layer of the first, second, third, fourth, fifth, and sixth metal layers 111a, 112a, 111b, 112b, 111c, and 112c.

According to the embodiment, the intermetallic compound layer may be provided with a thickness of several micrometers. For example, the intermetallic compound layer may be formed to have a thickness in a range of 1 micrometer to 3 micrometers.

When the first and second conductive layers 321 and 322 comprise a Sn material and the fifth and sixth metal layers 111c and 112c comprise a Ag material, an intermetallic compound layer of AgSn may be formed by a coupling of the Sn material and the Ag material, in the process of providing the first and second conductive layers 321 and 322 or the post-heat treatment process in which the first and second conductive layers 321 and 322 are provided.

In addition, when the first and second conductive layers 321 and 322 comprise a Sn material and the fifth and sixth metal layers 111c and 112c comprise a Au material, an intermetallic compound layer of AuSn may be formed by a coupling of the Sn material and the Au material, in the process of providing the first and second conductive layers 321 and 322 or the post-heat treatment process in which the first and second conductive layers 321 and 322 are provided.

In addition, when the first and second conductive layers 321 and 322 comprise a Sn material and the third and fourth metal layers 111b and 112b comprise a Cu material, an intermetallic compound layer of CuSn may be formed by a coupling of the Sn material and the Cu material, in the process of providing the first and second conductive layers 321 and 322 or the post-heat treatment process in which the first and second conductive layers 321 and 322 are provided.

In addition, when the first and second conductive layers 321 and 322 comprise a Ag material and at least one of the first, second, third, fourth, fifth, and sixth metal layers 111a, 112a, 111b, 112b, 111c, and 112c comprises a Sn material, an intermetallic compound layer of AgSn may be formed by a coupling of the Ag material and the Sn material, in the process of providing the first and second conductive layers 321 and 322 or the post-heat treatment process in which the first and second conductive layers 321 and 322 are provided.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package 100 according to the embodiment is bonded to a main board or the like through a reflow process, re-melting phenomenon does not occur, so there are advantages that electrical connection and physical bonding force are not deteriorated.

In addition, according to the light emitting device package 100 and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC).

Meanwhile, according to the embodiment, an intermetallic compound layer may also be formed between the first and second bonding parts 121 and 122 and the first and second conductive layers 321 and 322.

As described above, according to the embodiment, in the process of forming the first and second conductive layers 321 and 322, or the post-heat treatment process in which the first and second conductive layers 321 and 322 are provided, an intermetallic compound (IMC) layer may be formed between the first and second conductive layers 321 and 322 and the first and second bonding parts 121 and 122.

For example, an alloy layer may be formed by bonding between a material of the first and second conductive layers 321 and 322 and the first and second bonding parts 121 and 122.

Accordingly, the first conductive layer 321 and the first bonding part 121 can be physically and electrically coupled more stably. The first conductive layer 321, the alloy layer, and the first bonding part 121 can be physically and electrically coupled stably.

In addition, the second conductive layer 322 and the second bonding part 122 can be physically and electrically coupled more stably. The second conductive layer 322, the alloy layer, and the second bonding part 122 can be physically and electrically coupled stably.

For example, the alloy layer may comprise at least one intermetallic compound layer selected from a group including AgSn, CuSn, AuSn, and the like. The intermetallic compound layer may be formed by a coupling of a first material and a second material, and the first material may be provided from the first and second conductive layers 321 and 322, and the second material may be provided from the second bonding parts 121 and 122.

According to the embodiment, the intermetallic compound layer may be provided with a thickness of several micrometers. For example, the intermetallic compound layer may be formed to have a thickness in a range of 1 micrometer to 3 micrometers.

When the first and second conductive layers 321 and 322 comprise a Sn material and the first and second bonding parts 121 and 122 comprise a Ag material, an intermetallic compound layer of AgSn may be formed by a coupling of the Sn material and the Ag material, in the process of providing the first and second conductive layers 321 and 322 or the post-heat treatment process in which the first and second conductive layers 321 and 322 are provided.

In addition, when the first and second conductive layers 321 and 322 comprise a Sn material and the first and second bonding parts 121 and 122 comprise a Au material, an intermetallic compound layer of AuSn may be formed by a coupling of the Sn material and the Au material, in the process of providing the first and second conductive layers 321 and 322 or the post-heat treatment process in which the first and second conductive layers 321 and 322 are provided.

In addition, when the first and second conductive layers 321 and 322 comprise a Ag material and the first and second bonding parts 121 and 122 comprise a Sn material, an intermetallic compound layer of AgSn may be formed by a coupling of the Ag material and the Sn material, in the process of providing the first and second conductive layers 321 and 322 or the post-heat treatment process in which the first and second conductive layers 321 and 322 are provided.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package 100 according to the embodiment is bonded to a main board or the like through a reflow process, re-melting phenomenon does not occur, so there are advantages that electrical connection and physical bonding force are not deteriorated.

Meanwhile, according to the embodiment, an intermetallic compound layer may also be formed between the first and second conductors 221 and 222 and the first and second conductive layers 321 and 322.

As described above, according to the embodiment, in the process of forming the first and second conductive layers 321 and 322, or the post-heat treatment process in which the first and second conductive layers 321 and 322 are provided, an intermetallic compound (IMC) layer may be formed between the first and second conductive layers 321 and 322 and the first and second conductors 221 and 222.

For example, an alloy layer may be formed by bonding between a material of the first and second conductive layers 321 and 322 and the first and second conductors 221 and 222.

Accordingly, the first conductive layer 321 and the first conductor 221 can be physically and electrically coupled more stably. The first conductive layer 321, the alloy layer, and the first conductor 221 can be physically and electrically coupled stably.

In addition, the second conductive layer 322 and the second conductive body 222 can be physically and electrically coupled more stably. The second conductive layer 322, the alloy layer, and the second conductor 222 can be physically and electrically coupled stably.

For example, the alloy layer may comprise at least one intermetallic compound layer selected from a group including AgSn, CuSn, AuSn, and the like. The intermetallic compound layer may be formed by a coupling of a first material and a second material, and the first material may be provided from the first and second conductive layers 321 and 322, and the second material may be provided from the first and second conductors 221 and 222.

According to the embodiment, the intermetallic compound layer may be provided with a thickness of several micrometers. For example, the intermetallic compound layer may be formed to have a thickness in a range of 1 micrometer to 3 micrometers.

When the first and second conductive layers 321 and 322 comprise a Sn material and the first and second conductors 221 and 222 comprise a Ag material, an intermetallic compound layer of AgSn may be formed by a coupling of the Sn material and the Ag material, in the process of providing the first and second conductive layers 321 and 322 or the post-heat treatment process in which the first and second conductive layers 321 and 322 are provided.

In addition, when the first and second conductive layers 321 and 322 comprise a Sn material and the first and second conductors 221 and 222 comprise a Au material, an intermetallic compound layer of AuSn may be formed by a coupling of the Sn material and the Au material, in the process of providing the first and second conductive layers 321 and 322 or the post-heat treatment process in which the first and second conductive layers 321 and 322 are provided.

In addition, when the first and second conductive layers 321 and 322 comprise a Ag material and the first and second conductors 221 and 222 comprise a Sn material, an intermetallic compound layer of AgSn may be formed by a coupling of the Ag material and the Sn material, in the process of providing the first and second conductive layers 321 and 322 or the post-heat treatment process in which the first and second conductive layers 321 and 322 are provided.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package 100 according to the embodiment is bonded to a main board or the like through a reflow process, re-melting phenomenon does not occur, so there are advantages that electrical connection and physical bonding force are not deteriorated.

The molding part 140 may be provided on the light emitting device 120. The molding part 140 may be disposed on the first frame 111 and the second frame 112. The molding part 140 may be disposed in the cavity C provided by the package body 110.

The molding part 140 may comprise an insulating material. Also, the molding part 140 may comprise wavelength conversion means for receiving light emitted from the light emitting device 120 and providing wavelength-converted light. For example, the molding part 140 may comprise at least one selected from a group including phosphors, quantum dots, and the like.

Meanwhile, according to the embodiment, the molding part 140 may be formed after the first and second conductive layers 321 and 322 are formed. In addition, according to another embodiment of a method of manufacturing a light emitting device package of an embodiment, the molding part 140 is formed first, and the first conductive layer 321 and the second conductive layer 322 may be formed later.

In the light emitting device package 100 according to the embodiment, power may be connected to the first bonding part 121 through the first opening TH1 region, and power may be connected to the second bonding part 121 through the second opening TH2 region.

Accordingly, the light emitting device 120 can be driven by the driving power supplied through the first bonding part 121 and the second bonding part 122. The light emitted from the light emitting device 120 may be provided in an upward direction of the package body 110.

Meanwhile, the light emitting device package 100 according to the embodiment described above may be mounted on a submount, a circuit board, or the like and provided.

However, when the light emitting device package is mounted on the submount or the circuit board, a high temperature process such as a reflow process or the like may be applied. Here, in the reflow process, a re-melting phenomenon occurs in a bonding area between the frame and the light emitting device provided in the light emitting device package to deteriorate the stability of the electrical connection and the physical coupling, thereby an optical, electrical characteristics and reliability of the light emitting device package may be deteriorated.

However, according to the light emitting device package and the method of manufacturing the light emitting device package of the embodiment, the bonding part of the light emitting device according to the embodiment can receive the driving power through the conductive layer disposed in the opening. The melting point of the conductive layer disposed in the opening and the melting point of the intermetallic compound layer may be selected to have a higher value than the melting point of the common bonding material.

Therefore, even when the light emitting device package 100 according to the embodiment is bonded to a main board through a reflow process, re-melting phenomenon does not occur, so there are advantages that electrical connection and physical bonding force are not deteriorated.

In addition, according to the light emitting device package 100 and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC) resin.

Next, another example of a light emitting device package according to an embodiment will be described with reference to FIG. 9.

FIG. 9 is a view showing another example of a light emitting device package according to an embodiment of the present invention. In describing a light emitting device package according to an embodiment with reference to FIG. 9, descriptions overlapping with those described with reference to FIGS. 1 to 8 may be omitted.

The light emitting device package according to the embodiment may comprise a resin layer 115 disposed in the first and second openings TH1 and TH2, as shown in FIG. 9. The resin layer 115 may be disposed under the first and second conductive layers 321 and 322.

The resin layer 115 may protect the first and second conductive layers 321 and 322. The resin layer 115 may seal the first and second openings TH1 and TH2. The resin layer 115 may prevent the first and second conductive layers 321 and 322 from diffusing and moving under the first and second openings TH1 and TH2.

For example, the resin layer 115 may comprise a material similar to the body 113. The resin layer 115 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC).

In addition, the resin layer 115 may comprise at least one of an epoxy-based material, a silicone-based material, and a hybrid material including an epoxy-based material and a silicone-based material.

Next, another example of a light emitting device package according to an embodiment will be described with reference to FIG. 10.

Meanwhile, the light emitting device package according to the embodiment of the present invention shown in FIG. 10 shows another example in which the light emitting device package described with reference to FIGS. 1 to 9 is mounted on a circuit board 410 and supplied.

In describing a light emitting device package according to an embodiment of the present invention with reference to FIG. 10, descriptions overlapping with those described with reference to FIGS. 1 to 9 may be omitted.

The light emitting device package according to the embodiment may comprise a circuit board 410, a package body 110, and a light emitting device 120, as shown in FIG. 10.

The circuit board 410 may comprise a first pad 411, a second pad 412, and a board 413. The board 413 may be provided with a power supply circuit controlling the driving of the light emitting device 120.

The package body 110 may be disposed on the circuit board 410. The first pad 411 and the first bonding part 121 may be electrically connected to each other. The second pad 412 and the second bonding part 122 may be electrically connected to each other.

The first pad 411 and the second pad 412 may comprise a conductive material. For example, the first pad 411 and the second pad 412 may comprise at least one material selected from a group including Ti, Cu, Ni, Au, Cr, Ta, Pt, Sn, Ag, P, Fe, Sn, Zn, and Al or an alloy thereof. The first pad 411 and the second pad 412 may be provided as a single layer or a multilayer.

According to the embodiment, the first pad 411 of the circuit board 410 and the first conductive layer 321 may be electrically connected. Also, the second pad 412 of the circuit board 410 and the second conductive layer 322 may be electrically connected.

The first pad 411 may be electrically connected to the first frame 111. Also, the second pad 412 may be electrically connected to the second frame 112.

For example, the first conductive layer 321 and the second conductive layer 322 may be formed using a conductive paste. The conductive paste may comprise a solder paste, a silver paste, or the like, and may be composed of a multi-layer of different materials, or a multi-layer or a single layer composed of an alloy. For example, the first conductive layer 321 and the second conductive layer 322 may comprise a SAC (Sn—Ag—Cu) material.

According to the embodiment, in the process of forming the first and second conductive layers 321 and 322 or the post-heat treatment process in which the first and second conductive layers 321 and 322 are provided, an intermetallic compound (IMC) layer may be formed between the first and second conductive layers 321 and 322 and the first and second frames 111 and 112.

For example, an intermetallic compound layer can be formed by bonding between a material of the first and second conductive layers 321 and 322 and the first, second, third, fourth, fifth, and sixth metal layers 111a, 112a, 111b, 112b, 111c, and 112c of the first and second frames 111 and 112.

Accordingly, the first and second conductive layers 321 and 322 and the first and second frames 111 and 112 can be physically and electrically coupled to each other stably.

For example, the intermetallic compound layer may comprise at least one metal layer selected from a group including AgSn, CuSn, AuSn, and the like. The intermetallic compound layer may be formed by a coupling of a first material and a second material, and a first material may be provided from the first and second conductive layers 321 and 322, and a second material may be provided from at least one metal layer of the first, second, third, fourth, fifth, and sixth metal layers 111a, 112a, 111b, 112b, 111c, and 112c.

When the first and second conductive layers 321 and 322 comprise a Sn material and the fifth and sixth metal layers 111c and 112c comprise a Ag material, an intermetallic compound layer of AgSn may be formed by a coupling of the Sn material and the Ag material, in the process of providing the first and second conductive layers 321 and 322 or the post-heat treatment process in which the first and second conductive layers 321 and 322 are provided.

In addition, when the first and second conductive layers 321 and 322 comprise a Sn material and the fifth and sixth metal layers 111c and 112c comprise a Au material, an intermetallic compound layer of AuSn may be formed by a coupling of the Sn material and the Au material, in the process of providing the first and second conductive layers 321 and 322 or the post-heat treatment process in which the first and second conductive layers 321 and 322 are provided.

In addition, when the first and second conductive layers 321 and 322 comprise a Sn material and the third and fourth metal layers 111b and 112b comprise a Cu material, an intermetallic compound layer of CuSn may be formed by a coupling of the Sn material and the Cu material, in the process of providing the first and second conductive layers 321 and 322 or the post-heat treatment process in which the first and second conductive layers 321 and 322 are provided.

In addition, when the first and second conductive layers 321 and 322 comprise a Ag material and at least one of the first, second, third, fourth, fifth, and sixth metal layers 111a, 112a, 111b, 112b, 111c, and 112c comprises a Sn material, an intermetallic compound layer of AgSn may be formed by a coupling of the Ag material and the Sn material, in the process of providing the first and second conductive layers 321 and 322 or the post-heat treatment process in which the first and second conductive layers 321 and 322 are provided.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package 100 according to the embodiment is bonded to a main board or the like through a reflow process, re-melting phenomenon does not occur, so there are advantages that electrical connection and physical bonding force are not deteriorated.

In addition, according to the light emitting device package 100 and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC).

Meanwhile, according to the embodiment, an intermetallic compound layer may also be formed between the first and second bonding parts 121 and 122 and the first and second conductive layers 321 and 322.

As described above, according to the embodiment, in the process of forming the first and second conductive layers 321 and 322, or the post-heat treatment process in which the first and second conductive layers 321 and 322 are provided, an intermetallic compound (IMC) layer may be formed between the first and second conductive layers 321 and 322 and the first and second bonding parts 121 and 122.

For example, an alloy layer may be formed by bonding between a material of the first and second conductive layers 321 and 322 and the first and second bonding parts 121 and 122.

Accordingly, the first conductive layer 321 and the first bonding part 121 can be physically and electrically coupled more stably. The first conductive layer 321, the alloy layer, and the first bonding part 121 can be physically and electrically coupled stably.

In addition, the second conductive layer 322 and the second bonding part 122 can be physically and electrically coupled more stably. The second conductive layer 322, the alloy layer, and the second bonding part 122 can be physically and electrically coupled stably.

For example, the alloy layer may comprise at least one intermetallic compound layer selected from a group including AgSn, CuSn, AuSn, and the like. The intermetallic compound layer may be formed by a coupling of a first material and a second material, and the first material may be provided from the first and second conductive layers 321 and 322, and the second material may be provided from the second bonding parts 121 and 122.

According to the embodiment, the intermetallic compound layer may be provided with a thickness of several micrometers. For example, the intermetallic compound layer may be formed to have a thickness in a range of 1 micrometer to 3 micrometers.

When the first and second conductive layers 321 and 322 comprise a Sn material and the first and second bonding parts 121 and 122 comprise a Ag material, an intermetallic compound layer of AgSn may be formed by a coupling of the Sn material and the Ag material, in the process of providing the first and second conductive layers 321 and 322 or the post-heat treatment process in which the first and second conductive layers 321 and 322 are provided.

In addition, when the first and second conductive layers 321 and 322 comprise a Sn material and the first and second bonding parts 121 and 122 comprise a Au material, an intermetallic compound layer of AuSn may be formed by a coupling of the Sn material and the Au material, in the process of providing the first and second conductive layers 321 and 322 or the post-heat treatment process in which the first and second conductive layers 321 and 322 are provided.

In addition, when the first and second conductive layers 321 and 322 comprise a Ag material and the first and second bonding parts 121 and 122 comprise a Sn material, an intermetallic compound layer of AgSn may be formed by a coupling of the Ag material and the Sn material, in the process of providing the first and second conductive layers 321 and 322 or the post-heat treatment process in which the first and second conductive layers 321 and 322 are provided.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package 100 according to the embodiment is bonded to a main board or the like through a reflow process, re-melting phenomenon does not occur, so there are advantages that electrical connection and physical bonding force are not deteriorated.

Meanwhile, according to the embodiment, an intermetallic compound layer may also be formed between the first and second conductors 221 and 222 and the first and second conductive layers 321 and 322.

As described above, according to the embodiment, in the process of forming the first and second conductive layers 321 and 322, or the post-heat treatment process in which the first and second conductive layers 321 and 322 are provided, an intermetallic compound (IMC) layer may be formed between the first and second conductive layers 321 and 322 and the first and second conductors 221 and 222.

For example, an alloy layer may be formed by bonding between a material of the first and second conductive layers 321 and 322 and the first and second conductors 221 and 222.

Accordingly, the first conductive layer 321 and the first conductor 221 can be physically and electrically coupled more stably. The first conductive layer 321, the alloy layer, and the first conductor 221 can be physically and electrically coupled stably.

In addition, the second conductive layer 322 and the second conductive body 222 can be physically and electrically coupled more stably. The second conductive layer 322, the alloy layer, and the second conductor 222 can be physically and electrically coupled stably.

For example, the alloy layer may comprise at least one intermetallic compound layer selected from a group including AgSn, CuSn, AuSn, and the like. The intermetallic compound layer may be formed by a coupling of a first material and a second material, and the first material may be provided from the first and second conductive layers 321 and 322, and the second material may be provided from the first and second conductors 221 and 222.

According to the embodiment, the intermetallic compound layer may be provided with a thickness of several micrometers. For example, the intermetallic compound layer may be formed to have a thickness in a range of 1 micrometer to 3 micrometers.

When the first and second conductive layers 321 and 322 comprise a Sn material and the first and second conductors 221 and 222 comprise a Ag material, an intermetallic compound layer of AgSn may be formed by a coupling of the Sn material and the Ag material, in the process of providing the first and second conductive layers 321 and 322 or the post-heat treatment process in which the first and second conductive layers 321 and 322 are provided.

In addition, when the first and second conductive layers 321 and 322 comprise a Sn material and the first and second conductors 221 and 222 comprise a Au material, an intermetallic compound layer of AuSn may be formed by a coupling of the Sn material and the Au material, in the process of providing the first and second conductive layers 321 and 322 or the post-heat treatment process in which the first and second conductive layers 321 and 322 are provided.

In addition, when the first and second conductive layers 321 and 322 comprise a Ag material and the first and second conductors 221 and 222 comprise a Sn material, an intermetallic compound layer of AgSn may be formed by a coupling of the Ag material and the Sn material, in the process of providing the first and second conductive layers 321 and 322 or the post-heat treatment process in which the first and second conductive layers 321 and 322 are provided.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package according to the embodiment is bonded to a main board or the like through a reflow process, re-melting phenomenon does not occur, so there are advantages that electrical connection and physical bonding force are not deteriorated.

In addition, according to the embodiment, a resin layer 115 may be disposed under the first conductive layer 321 of the first opening TH1. The resin layer 115 may seal the lower surface of the first opening TH1.

Therefore, when the light emitting device package is mounted on a circuit board, the first conductive layer 321 and the second conductive layer 322 can be prevented from being in contact with each other to be short-circuited, and the amount of the first and second conductive layers 321 and 322 can be very easily controlled in a disposing process of the first and second conductive layers 321 and 322.

In addition, according to the embodiment, the resin layer 115 may be disposed under the second conductive layer 322 of the second opening TH2. The resin layer 115 may seal the lower surface of the second opening TH2.

Therefore, when the light emitting device package is mounted on a circuit board, the first conductive layer 321 and the second conductive layer 322 can be prevented from being in contact with each other to be short-circuited, and the amount of the first and second conductive layers 321 and 322 can be very easily controlled in a disposing process of the first and second conductive layers 321 and 322.

Meanwhile, according to the embodiment, an additional bonding layer may be further provided between the first pad 411 and the first frame 111. Also, an additional bonding layer may be further provided between the second pad 412 and the second frame 112.

According to the embodiment, similar to that described above, in a process where the package body 110 is mounted on the board 410, a material constituting the first pad 411 or a bonding material provided on the first pad 411 can be prevented from being diffused and moved toward the first opening TH1 by the resin part provided in the first lower recess R11.

In addition, according to the embodiment, in the process where the package body 110 is mounted on the board 410, a material constituting the second pad 412 or a bonding material provided on the second pad 412 can be prevented from being diffused and moved toward the second opening TH2 by the resin part provided in the second lower recess R12.

In the light emitting device package according to the embodiment described with reference to FIG. 10, power supplied from the circuit board 410 is transmitted to the first bonding part 121 and the second bonding part 122 through the first conductive layer 321 and the second conductive layer 322, respectively. At this time, the first pad 411 of the circuit board 410 and the first frame 111 can be in direct contact, and the second pad 412 of the circuit board 410 and the second frame 112 can be in direct contact.

As described above, according to the light emitting device package and the method of manufacturing the light emitting device package of the embodiment, the bonding part of the light emitting device according to the embodiment can receive the driving power through the conductive layer disposed in the opening. Also, the melting point of the conductive layer disposed in the opening and the melting point of the intermetallic compound layer may be selected to have a higher value than the melting point of the common bonding material.

Therefore, even when the light emitting device package 100 according to the embodiment is bonded to a main board through a reflow process, re-melting phenomenon does not occur, so there are advantages that electrical connection and physical bonding force are not deteriorated.

In addition, according to the light emitting device package and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC) resin.

Meanwhile, in the case of the light emitting device package according to the embodiment described above, it has been described based on the case where one opening is provided under each bonding part.

However, according to a light emitting device package according to another embodiment, a plurality of openings may be provided under each bonding part. Further, the plurality of openings may be provided as openings having different widths.

In addition, the shape of the opening according to the embodiment may be provided in various shapes.

For example, the opening according to the embodiment may be provided with the same width from the upper region to the lower region.

In addition, the opening according to the embodiment may be provided in a multi-step structure. For example, the opening may be provided in a shape having a different inclination angle of the two-step structure. Further, the opening may be provided in a shape having three or more different inclination angles.

Further, the opening may be provided in a shape in which the width changes from the upper region to the lower region. As an example, the opening may be provided in a shape having a curvature from the upper region to the lower region.

Meanwhile, according to the light emitting device package of the embodiment described above, it was described based on the case where the first and second conductors 221 and 222 are disposed under the first and second bonding parts 121 and 122. However, when the electrical contact areas between the first and second bonding parts 121 and 122, and the first and second conductive layers 321 and 322 are sufficiently provided, the first and second conductors 221 and 222 may not be provided and may be omitted.

In addition, according to the light emitting device package of the embodiment described above, the package body 110 may include only the support member 113 having a flat upper surface, and may not be provided with inclined reflection parts.

In other words, according to the light emitting device package of the embodiment, the package body 110 may be provided with a structure providing a cavity C. In addition, the package body 110 may be provided with a flat upper surface without providing a cavity C.

Next, another example of a light emitting device package according to an embodiment will be described with reference to FIG. 11.

FIG. 11 is a view illustrating another example of a light emitting device package according to an embodiment of the present invention. In describing a light emitting device package of the embodiment with reference to FIG. 11, descriptions overlapping with those described with reference to FIGS. 1 to 10 may be omitted.

The light emitting device package according to the embodiment may comprise a package body 110 and a light emitting device 120.

The package body 110 may comprise a first frame 111 and a second frame 112. The first frame 111 and the second frame 112 may be spaced apart from each other.

The package body 110 may comprise a body 113. The body 113 may be disposed between the first frame 111 and the second frame 112. The body 113 may function as an electrode separation line.

The package body 110 may comprise a first opening TH1 and a second opening TH2 passing through from the upper surface to the lower surface in a first direction. The first frame 111 may comprise the first opening TH1. The second frame 112 may comprise the second opening TH2.

The first opening TH1 may be provided in the first frame 111. The first opening TH1 may be provided passing through the first frame 111. The first opening TH1 may be provided passing through the upper surface and the lower surface of the first frame 111 in a first direction.

The first opening TH1 may be disposed under the first bonding part 121 of the light emitting device 120. The first opening TH1 may be provided to overlap with the first bonding part 121 of the light emitting device 120. The first opening TH1 may be provided to overlap with the first bonding part 121 of the light emitting device 120 in a first direction toward the lower surface from the upper surface of the first frame 111. The first bonding part 121 may be disposed on the first opening TH1.

The second opening TH2 may be provided in the second frame 112. The second opening TH2 may be provided passing through the second frame 112. The second opening portion TH2 may be provided passing through the upper surface and the lower surface of the second frame 112 in a first direction.

The second opening TH2 may be disposed under the second bonding part 122 of the light emitting device 120. The second opening TH2 may be provided to overlap with the second bonding part 122 of the light emitting device 120. The second opening TH2 may be provided to overlap with the second bonding part 122 of the light emitting device 120 in a first direction toward the lower surface from the upper surface of the second frame 112. The second bonding part 122 may be disposed on the second opening TH2.

The first opening TH1 and the second opening TH2 may be spaced apart from each other. The first opening TH1 and the second opening TH2 may be spaced apart from each other under the lower surface of the light emitting device 120.

According to the embodiment, the width W1 of the upper region of the first opening TH1 may be provided less than or equal to the width of the first bonding part 121. In addition, the width of the upper region of the second opening TH2 may be provided less than or equal to the width of the second bonding part 122.

The area of the upper region of the first opening TH1 may be provided smaller than the area of the lower surface of the first bonding part 121. Also, the area of the upper region of the second opening TH2 may be provided smaller than the area of the lower surface of the second bonding part 122.

Meanwhile, the first and second frames 111 and 112 may comprise a support member and a metal layer surrounding the support member.

According to the embodiment, after an etching process or a punching process for the support member is completed to form the first and second openings TH1 and TH2, a plating process or the like for the support members constituting the first and second frames 111 and 112 may be performed so that the metal layer may be formed. Accordingly, the metal layer may be formed on the surfaces of the support members constituting the first and second frames 111 and 112.

For example, the first frame 111 may comprise a first metal layer 111a, a third metal layer 111b, and a fifth metal layer 111c. In addition, the second frame 112 may comprise a second metal layer 112a, a fourth metal layer 112b, and a sixth metal layer 112c.

The first metal layer 111a and the second metal layer 112a may be referred to as supporting members for forming the first and second frames 111 and 112. The third, fourth, fifth, and sixth metal layers 111b, 112b, 111c, and 112c may be formed through a plating process, for example.

The third metal layer 111b may be disposed on a side surface of the first metal layer 111a. The third metal layer 111b may be disposed between the first metal layer 111a and the first opening TH1. In addition, a portion of the third metal layer 111b may be disposed on the upper surface of the first metal layer 111a.

The fifth metal layer 111c may be disposed on the upper, lower, and side surfaces of the first metal layer 111a. The fifth metal layer 111c may be disposed on the upper, lower, and side surfaces of the third metal layer 111b. The fifth metal layer 111c may be disposed between the side surface of the third metal layer 111b and the first opening TH1.

The fourth metal layer 112b may be disposed on a side surface of the second metal layer 112a. The fourth metal layer 112b may be disposed between the second metal layer 112a and the second opening TH2. In addition, a portion of the fourth metal layer 112b may be disposed on the upper surface of the second metal layer 112a.

The sixth metal layer 112c may be disposed on the upper, lower, and side surfaces of the second metal layer 112a. The sixth metal layer 112c may be disposed on the upper, lower, and side surfaces of the fourth metal layer 112b. The sixth metal layer 112c may be disposed between the side surface of the fourth metal layer 112b and the second opening TH2.

For example, the first and second metal layers 111a and 112a may be provided as a Cu layer. Also, the third and fourth metal layers 111b and 112b may be provided as a Cu layer or a Ni layer. Also, the fifth and sixth metal layers 111c and 112c may comprise at least one of a Ni layer, a Ag layer, a Au layer, and the like.

Each of the first, second, third, fourth, fifth, and sixth metal layers 111a, 112a, 111b, 112b, 111c, and 112c may be a single layer or multiple layers. In addition, each of the first, second, third, fourth, fifth, and sixth metal layers 111a, 112a, 111b, 112b, 111 c, and 112c may be formed of a single material or an alloy.

The third and fourth metal layers 111b and 112b may reduce the sizes of the openings provided by the first and second metal layers 111a and 111b. In addition, the fifth and sixth metal layers 111c and 112c may provide a function of reflecting light provided from the light emitting device 120.

When the sizes of the openings provided by the first and second metal layers 111a and 111b are larger than the sizes of the first and second bonding parts 121 and 122, light provided from the light emitting device 120 can be incident on the openings provided by the first and second metal layers 111a and 111b.

At this time, when the openings provided by the first and second metal layers 111a and 111 b are provided as a void space or filled with a transparent material, the light provided from the light emitting device 120 may be emitted downward through the openings provided by the first and second metal layers 111a and 111b. Also, when the opening provided by the first and second metal layers 111a and 111b is filled with a non-reflective material, the light provided from the light emitting device 120 may be absorbed by the non-reflective material provided in the opening.

When the sizes of the openings provided by the first and second metal layers 111a and 111b are larger than the sizes of the first and second bonding parts 121 and 122, the extraction efficiency of the light emitting device package can be lowered.

However, according to the embodiment, the sizes of the first and second openings TH1 and TH2 may be adjusted by the third, fourth, fifth, and sixth metal layers 111b, 112b, 111c, and 112c to be provided smaller than the size of the first and second bonding parts 121 and 122. In addition, since the light provided from the light emitting device 120 can be reflected upward by the fifth and sixth metal layers 111c and 112c, the light extraction efficiency can be improved.

In the process of forming the openings in the first and second frames 111 and 112, for example, a punching process or the like may be used. At this time, when the opening is formed through the punching process, the diameter of the opening may be provided by several hundreds of micrometers.

Here, it will be explained again later, depending on the type of the light emitting device 120 applied to the light emitting device package of the embodiment, the widths or diameters of the first and second bonding parts 121 and 122 may be provided several tens of micrometers to several hundreds of micrometers.

According to the light emitting device package of the embodiment, for the large opening formed through a punching process or the like, it is possible to provide the first and second openings TH1 and TH2 having a smaller size than the width or diameter of the first and second bonding parts 121 and 122 through at least one of the third, fourth, fifth, and sixth metal layers 111b, 112b, 111c, and 112c.

For example, according to the embodiment, when the widths or diameters of the first and second bonding parts 121 and 122 are several tens of micrometers, it is possible to provide the first and second openings TH1 and TH2 having a smaller size than the width or diameter of the first and second bonding parts 121 and 122 by forming at least one of the third, fourth, fifth, and sixth metal layers 111b, 112b, 111c, and 112c.

In addition, when at least one of the third, fourth, fifth, and sixth metal layers 111b, 112b, 111c, and 112c comprises a Ni layer, the Ni layer has a small change in thermal expansion, so that even when the size or placement of the package body by thermal expansion is changed, the position of the light emitting device 120 disposed on the upper portion can be stably fixed by the Ni layer. When the fifth and sixth metal layers 111c and 112c comprise a Ag layer, the Ag layer can efficiently reflect light emitted from the light emitting device disposed in the upper portion and improve light intensity.

The width W3 between the first opening TH1 and the second opening TH2 in the lower surface region of the first frame 111 and the second frame 112 may be provided several hundreds of micrometers. The width W3 between the first opening TH1 and the second opening TH2 in the lower surface region of the first frame 111 and the second frame 112 may be provided, for example, 100 micrometers to 150 micrometers.

The width W3 between the first opening TH1 and the second opening TH2 in the lower surface region of the first frame 111 and the second frame 112 may be selected to be provided larger than a certain distance in order to prevent electric short between the pads when the light emitting device package 100 of the embodiment is later mounted on a circuit board, a submount, or the like.

The light emitting device package according to the embodiment may comprise a first resin 130, as shown in FIG. 11.

The first resin 130 may be disposed between the body 113 and the light emitting device 120. The first resin 130 may be disposed between the upper surface of the body 113 and the lower surface of the light emitting device 120.

In addition, the light emitting device package according to the embodiment may comprise a recess R as shown in FIG. 11.

The recesses R may be provided in the body 113. The recess R may be provided between the first opening TH1 and the second opening TH2. The recess R may be provided to be recessed toward a lower surface from an upper surface of the body 113. The recess R may be disposed under the light emitting device 120. The recess R may be provided to overlap with the light emitting device 120 in the first direction.

For example, the first resin 130 may be disposed in the recess R. The first resin 130 may be disposed between the light emitting device 120 and the body 113. The first resin 130 may be disposed between the first bonding part 121 and the second bonding part 122. For example, the first resin 130 may be disposed in contact with a side surface of the first bonding part 121 and a side surface of the second bonding part 122.

The first resin 130 may provide a stable fixing force between the light emitting device 120 and the package body 110. The first resin 130 may provide a stable fixing force between the light emitting device 120 and the body 113. The first resin 130 may be disposed in direct contact with the upper surface of the body 113, for example. In addition, the first resin 130 may be disposed in direct contact with the lower surface of the light emitting device 120.

For example, the first resin 130 may comprise at least one of an epoxy-based material, a silicone-based material, and a hybrid material including an epoxy-based material and a silicone-based material. For example, the first resin 130 may comprise a white silicone.

The first resin 130 may provide a stable fixing force between the body 113 and the light emitting device 120, when the light is emitted to the lower surface of the light emitting device 120, and the first resin may provide a light diffusing function between the light emitting device 120 and the body 113. When the light is emitted from the light emitting device 120 to the lower surface of the light emitting device 120, the first resin 130 provides a light diffusion function to improve the light extraction efficiency of the light emitting device package. In addition, the first resin 130 may reflect light emitted from the light emitting device 120. When the first resin 130 comprises a reflection function, the first resin 130 may be formed of a material including $TiO_2$, silicone, and the like.

In addition, the light emitting device package according to the embodiment may comprise a molding part 140. The molding part 140 may be provided on the light emitting device 120. The molding part 140 may be disposed on the first frame 111 and the second frame 112. The molding part 140 may be disposed in a cavity C provided by the package body 110.

The light emitting device package according to the embodiment may comprise a first conductor 221 and a second conductor 222, as shown in FIG. 11. In addition, the light emitting device package according to the embodiment may comprise a first conductive layer 321 and a second conductive layer 322. The first conductive layer 321 may be spaced apart from the second conductive layer 322.

The first conductor 221 may be disposed under the first bonding part 121. The first conductor 221 may be electrically connected to the first bonding part 121. The first conductor 221 may be disposed to overlap with the first bonding part 121 in the first direction.

The first conductor 221 may be provided in the first opening TH1. The first conductor 221 may be disposed between the first bonding part 121 and the first conductive layer 321. The first conductor 221 may be electrically connected to the first bonding part 121 and the first conductive layer 321.

The lower surface of the first conductor 221 may be disposed lower than the upper surface of the first opening TH1. The lower surface of the first conductor 221 may be disposed lower than the upper surface of the first conductive layer 321.

The first conductor 221 may be disposed on the first opening TH1. In addition, the first conductor 221 may extend from the first bonding part 121 into the inside of the first opening TH1.

In addition, the second conductor 222 may be disposed under the second bonding part 122. The second conductor 222 may be electrically connected to the second bonding part 122. The second conductor 222 may be disposed to overlap with the second bonding part 122 in the first direction.

The second conductor 222 may be provided in the second opening TH2. The second conductor 222 may be disposed between the second bonding part 122 and the second conductive layer 322. The second conductor 222 may be electrically connected to the second bonding part 122 and the second conductive layer 322.

The lower surface of the second conductor 222 may be disposed lower than the upper surface of the second opening TH2. The lower surface of the second conductor 222 may be disposed lower than the upper surface of the second conductive layer 322.

The second conductor 222 may be disposed on the second opening TH2. The second conductor 222 may extend from the second bonding part 122 into the inside of the second opening TH2.

According to the embodiment, the first conductive layer 321 may be disposed on a lower surface and a side surface of the first conductor 221. The first conductive layer 321 may be disposed in direct contact with the lower surface and the side surface of the first conductor 221. The lower surface of the first conductive layer 321 may have a concave shape from the lower portion to the upper portion.

In addition, according to the embodiment, the second conductive layer 322 may be disposed on a lower surface and a side surface of the second conductor 222. The second conductive layer 322 may be disposed in direct contact with the lower surface and the side surface of the second conductor 222. The lower surface of the second conductive layer 322 may have a concave shape from the lower portion to the upper portion.

The first conductive layer 321 may be provided in the first opening TH1. The first conductive layer 321 may be disposed under the first bonding part 121. The width of the first conductive layer 321 may be provided smaller than the width of the first bonding part 121.

The first bonding part 121 may have a width in a second direction perpendicular to the first direction in which the first opening TH1 is formed. The width of the first bonding part 121 may be provided greater than the width of the first opening TH1 in the second direction.

The first conductive layer 321 may be disposed in direct contact with the lower surface of the first bonding part 121. The first conductive layer 321 may be electrically connected to the first bonding part 121. The first conductive layer 321 may be surrounded by the first frame 111. The lower surface of the first conductive layer 321 may have a concave shape from the lower portion to the upper portion.

The second conductive layer 322 may be provided in the second opening TH2. The second conductive layer 322 may be disposed under the second bonding part 122. The width of the second conductive layer 322 may be provided smaller than the width of the second bonding part 122.

The second bonding part 122 may have a width in a second direction perpendicular to the first direction in which the second opening TH2 is formed. The width of the second bonding part 122 may be provided greater than the width of the second opening TH2 in the second direction.

The second conductive layer 322 may be disposed in direct contact with the lower surface of the second bonding part 122. The second conductive layer 322 may be electrically connected to the second bonding part 122. The second conductive layer 322 may be disposed so as to be surrounded by the second frame 112. The lower surface of the second conductive layer 322 may have a concave shape from the lower portion to the upper portion.

The first conductive layer 321 and the second conductive layer 322 may comprise a material selected from a group including Ag, Au, Pt, Sn, Cu, and the like, or an alloy thereof. However, it is not limited thereto, and the first conductive layer 321 and the second conductive layer 322 may be formed of a material capable of ensuring a conductive function.

For example, the first conductive layer 321 and the second conductive layer 322 may be formed using a conductive paste. The conductive paste may comprise a solder paste, a silver paste, or the like, and may be composed of a multi-layer composed of different materials, or a multi-layer or a single layer composed of an alloy. For example, the first conductive layer 321 and the second conductive layer 322 may comprise a SAC (Sn—Ag—Cu) material.

According to the embodiment, in the process of forming the first and second conductive layers 321 and 322 or the post-heat treatment process in which the first and second conductive layers 321 and 322 are provided, an intermetallic compound (IMC) layer may be formed between the first and second conductive layers 321 and 322 and the first and second frames 111 and 112.

For example, an intermetallic compound layer can be formed by bonding between a material of the first and second conductive layers 321 and 322 and the first, second, third, fourth, fifth, and sixth metal layers 111a, 112a, 111b, 112b, 111c, and 112c of the first and second frames 111 and 112.

Accordingly, the first and second conductive layers 321 and 322 and the first and second frames 111 and 112 can be physically and electrically coupled to each other stably.

For example, the intermetallic compound layer may comprise at least one metal layer selected from a group including AgSn, CuSn, AuSn, and the like. The intermetallic compound layer may be formed by a coupling of a first material and a second material, and a first material may be provided from the first and second conductive layers 321 and 322, and a second material may be provided from at least one metal layer of the first, second, third, fourth, fifth, and sixth metal layers 111a, 112a, 111b, 112b, 111c, and 112c.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package 100 according to the embodiment is bonded to a main board or the like through a reflow process, re-melting phenomenon does not occur, so there are advantages that electrical connection and physical bonding force are not deteriorated.

In addition, according to the light emitting device package 100 and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC).

Meanwhile, according to the embodiment, an intermetallic compound layer may also be formed between the first and second bonding parts 121 and 122 and the first and second conductive layers 321 and 322.

As described above, according to the embodiment, in the process of forming the first and second conductive layers 321 and 322, or the post-heat treatment process in which the first and second conductive layers 321 and 322 are provided, an intermetallic compound (IMC) layer may be formed between the first and second conductive layers 321 and 322 and the first and second bonding parts 121 and 122.

For example, an alloy layer may be formed by bonding between a material of the first and second conductive layers 321 and 322 and the first and second bonding parts 121 and 122.

For example, the alloy layer may comprise at least one intermetallic compound layer selected from a group including AgSn, CuSn, AuSn, and the like. The intermetallic compound layer may be formed by a coupling of a first material and a second material, and the first material may be provided from the first and second conductive layers 321 and 322, and the second material may be provided from the second bonding parts 121 and 122.

Meanwhile, according to the embodiment, an intermetallic compound layer may also be formed between the first and second conductors 221 and 222 and the first and second conductive layers 321 and 322.

As described above, according to the embodiment, in the process of forming the first and second conductive layers 321 and 322, or the post-heat treatment process in which the first and second conductive layers 321 and 322 are provided, an intermetallic compound (IMC) layer may be formed between the first and second conductive layers 321 and 322 and the first and second conductors 221 and 222.

For example, an alloy layer may be formed by bonding between a material of the first and second conductive layers 321 and 322 and the first and second conductors 221 and 222.

For example, the alloy layer may comprise at least one intermetallic compound layer selected from a group including AgSn, CuSn, AuSn, and the like. The intermetallic compound layer may be formed by a coupling of a first material and a second material, and the first material may be provided from the first and second conductive layers 321 and 322, and the second material may be provided from the first and second conductors 221 and 222.

In addition, the light emitting device package according to the embodiment may comprise a first lower recess R11 and a second lower recess R12, as shown in FIG. 11. The first lower recess R11 and the second lower recess R12 may be spaced apart from each other.

The first lower recess R11 may be provided on a lower surface of the first frame 111. The first lower recess R11 may be provided to be concaved from the lower surface toward the upper surface of the first frame 111. The first lower recess R11 may be spaced apart from the first opening TH1.

The first lower recess R11 may be provided with a width in a range of several micrometers to several tens of micrometers. A resin part may be provided in the first lower recess R11. The resin part filled in the first lower recess R11 may be provided with the same material as the body 113, for example.

The resin part filled in the first lower recess R11 may be disposed around the lower surface region of the first frame 111 providing the first opening TH1. The lower surface area of the first frame 111 providing the first opening TH1 may be disposed as a kind of an island in a shape separated from an adjacent lower surface forming the first frame 111.

For example, as described with reference to FIG. 2, the lower surface area of the first frame 111 providing the first opening TH1 may be isolated from the adjacent first frame 111 by the resin part filled in the first lower recess R11 and the body 113.

Accordingly, when the resin part is disposed of a material having poor adhesion and wettability with the first and second conductive layers 321 and 322, or a material having a low surface tension between the resin part and the first and second conductive layers 321 and 322, it can be prevented that the first conductive layer 321 provided in the first opening TH1 is moved from the first opening TH1 and spreads beyond the resin part filled in the first lower recess R11 or the body 113.

Therefore, it can be prevented that the first conductive layer 321 overflows or spreads out of the region where the resin part or body 113 is provided by overflowing from the first opening TH1 toward the region where the resin part or the body 113 is provided, and the first conductive layer 321 can be stably disposed in an area where the first opening TH1 is provided.

In addition, the second lower recess R12 may be provided on a lower surface of the second frame 112. The second lower recess R12 may be provided to be concaved from the lower surface toward the upper surface of the second frame 112. The second lower recess R12 may be spaced apart from the second opening TH2.

The second lower recess R12 may be provided with a width in a range of several micrometers to tens of micrometers. A resin part may be provided in the second lower recess R12. The resin part filled in the second lower recess R12 may be provided with the same material as the body 113, for example.

A resin part filled in the second lower recess R12 may be disposed around a lower surface region of the second frame 112 providing the second opening TH2. The lower surface area of the second frame 112 providing the second opening TH2 may be disposed as a kind of an island in a shape separated from an adjacent lower surface forming the second frame 112.

For example, as described with reference to FIG. 2, the lower surface area of the second frame 112 providing the second opening TH2 may be isolated from the adjacent second frame 112 by the resin part filled in the second lower recess R12 and the body 113.

Accordingly, when the resin part is disposed of a material having poor adhesion and wettability with the first and second conductive layers 321 and 322, or a material having a low surface tension between the resin part and the first and second conductive layers 321 and 322, it can be prevented that the second conductive layer 322 provided in the second opening TH2 is moved from the second opening TH2 and spreads beyond the resin part filled in the second lower recess R12 or the body 113.

Therefore, it can be prevented that the second conductive layer 322 overflows or spreads out of the region where the resin part or body 113 is provided by overflowing from the second opening TH2 toward the region where the resin part or the body 113 is provided, and the second conductive layer 322 can be stably disposed in an area where the second opening TH2 is provided.

Meanwhile, according to the light emitting device package of the embodiment, as shown in FIG. 11, the first resin 130 provided on the recess R may be provided between the lower surface of the light emitting device 120 and the upper surfaces of the package body 110. The first resin 130 may be provided around the first and second bonding parts 121 and 122 when viewed from the above the light emitting device 120. In addition, the first resin 130 may be provided around the first and second openings TH1 and TH2 when viewed from above the light emitting device 120.

The first resin 130 may function to stably fix the light emitting device 120 to the package body 110. Also, the first resin 130 may be disposed around the first and second bonding parts 121 and 122 in contact with the side surfaces of the first and second bonding parts 121 and 122.

The first resin 130 may seal the periphery of the first and second bonding parts 121 and 122. The first resin 130 may prevent the first conductive layer 321 and the second conductive layer 322 from diffusing and moving outside the first opening TH1 region and the second opening TH2 region in the direction of the outer surface of the light emitting device 120. When the first and second conductive layers 321 and 322 diffuse and move in the direction of the outer surface of the light emitting device 120, the first and second conductive layers 321 and 322 may contact the active layer of the light emitting device 120, thereby causing defects due to short circuit. Accordingly, when the first resin 130 is disposed, short circuit caused by the first and second conductive layers 321 and 322 and the active layer can be prevented, thereby improving the reliability of the light emitting device package according to the embodiment.

In addition, the first resin 130 can prevent the first conductive layer 321 and the second conductive layer 322 from being diffused toward the recess R under the lower surface of the light emitting device 120 beyond the first opening TH1 region and the second opening TH2 region. Accordingly, it is possible to prevent the first conductive layer 321 and the second conductive layer 322 from being electrically shorted under the light emitting device 120.

As described above, according to the light emitting device package and the method of manufacturing the light emitting device package of the embodiment, the bonding part of the light emitting device according to the embodiment can receive the driving power through the conductive layer disposed in the opening. Also, the melting point of the conductive layer disposed in the opening and the melting point of the intermetallic compound layer may be selected to have a higher value than the melting point of the common bonding material.

Therefore, even when the light emitting device package 100 according to the embodiment is bonded to a main board through a reflow process, re-melting phenomenon does not occur, so there are advantages that electrical connection and physical bonding force are not deteriorated.

In addition, according to the light emitting device package and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC) resin.

Meanwhile, the light emitting device package described above may be provided with a flip chip light emitting device as an example.

For example, the flip chip light emitting device may be provided as a transmissive flip chip light emitting device that emits light in six surface directions, or may be provided as a reflective flip chip light emitting device that emits light in five surface directions.

The reflective flip chip light emitting device that emits light in five surface directions may have a structure in which a reflective layer is disposed in a direction close to the package body 110. For example, the reflective flip chip light emitting device may comprise an insulating reflective layer, such as a Distributed Bragg Reflector, an Omni Directional Reflector, and the like and/or a conductive reflective layer such as Ag, Al, Ni, Au, and the like.

In addition, the flip chip light emitting device that emits light in six surface directions may comprise a first electrode electrically connected to the first conductivity type semiconductor layer and a second electrode electrically connected to the second conductivity type semiconductor layer, and may be provided as a general horizontal light emitting device in which light is emitted between the first electrode and the second electrode.

In addition, the flip chip light emitting device that emits light in six surface directions may be provided as a transmissive flip chip light emitting device including both a reflective region between the first and second bonding parts in which a reflective layer is disposed and a transmissive region in which light is emitted.

Here, the transmissive flip chip light emitting device means a device that emits light to six surfaces including an upper surface, four side surfaces, and a lower surface. In addition, the reflective flip chip light emitting device means a device that emits light to five surfaces including an upper surface and four side surfaces.

Hereinafter, an example of a flip chip light emitting device applied to a light emitting device package according to an embodiment of the present invention will be described with reference to the accompanying drawings.

FIG. 12 is a plan view illustrating an electrode arrangement of a light emitting device applied to a light emitting device package according to an embodiment of the present invention, and FIG. 13 is a cross-sectional view taken along line F-F of the light emitting device shown in FIG. 12.

Meanwhile, in FIG. 12, to make understanding easier, only the relative arrangement of the first electrode 127 and the second electrode 128 is conceptually shown. The first electrode 127 may comprise a first bonding part 121 and a first branch electrode 125. The second electrode 128 may comprise a second bonding part 122 and a second branch electrode 126.

A light emitting device according to an embodiment may comprise a light emitting structure 123 disposed on a substrate 124.

The substrate 124 may be selected from a group including a sapphire substrate (Al$_2$O$_3$), SiC, GaAs, GaN, ZnO, Si, GaP, InP and Ge. For example, the substrate 124 may be provided as a patterned sapphire substrate (PSS) having a concavo-convex pattern formed on its upper surface.

The light emitting structure 123 may comprise a first conductivity type semiconductor layer 123a, an active layer 123b, and a second conductivity type semiconductor layer 123c. The active layer 123b may be disposed between the first conductivity type semiconductor layer 123a and the second conductivity type semiconductor layer 123c. For example, the active layer 123b may be disposed on the first conductivity type semiconductor layer 123a, and the second conductivity type semiconductor layer 123c may be disposed on the active layer 123b.

According to the embodiment, the first conductivity type semiconductor layer 123a may be provided as an n-type semiconductor layer and the second conductivity type semiconductor layer 123c may be provided as a p-type semiconductor layer. Of course, according to another embodiment, the first conductivity type semiconductor layer 123a may be provided as a p-type semiconductor layer, and the second conductivity type semiconductor layer 123c may be provided as an n-type semiconductor layer.

The light emitting device according to the embodiment may comprise a first electrode 127 and a second electrode 128.

The first electrode 127 may comprise a first bonding part 121 and a first branch electrode 125. The first electrode 127 may be electrically connected to the second conductivity type semiconductor layer 123c. The first branch electrodes 125 may be branched from the first bonding part 121. The first branch electrode 125 may comprise a plurality of branch electrodes branched from the first bonding part 121.

The second electrode 128 may comprise a second bonding part 122 and a second branch electrode 126. The second electrode 128 may be electrically connected to the first conductivity type semiconductor layer 123a. The second branch electrode 126 may be branched from the second bonding part 122. The second branch electrode 126 may comprise a plurality of branch electrodes branched from the second bonding part 122.

The first branch electrode 125 and the second branch electrode 126 may be arranged to be offset from each other in a finger shape. The power supplied through the first bonding part 121 and the second bonding part 122 by the first branch electrode 125 and the second branch electrode 126 can be diffused and provided to the entire light emitting structure 123.

The first electrode 127 and the second electrode 128 may have a single-layer structure or a multi-layer structure. For example, the first electrode 127 and the second electrode 128 may be ohmic electrodes. For example, the first electrode 127 and the second electrode 128 may be formed of at least one or an alloy of two or more of ZnO, IrO$_x$, RuO$_x$, NiO, RuO$_x$/ITO, Ni/IrO$_x$/Au, Ni/IrO$_x$/Au/ITO, Ag, Ni, Cr, Ti, Al, Rh, Pd, Ir, Ru, Mg, Zn, Pt, Au and Hf.

Meanwhile, a protective layer may be further provided to the light emitting structure 123. The protective layer may be provided on the upper surface of the light emitting structure 123. Further, the protective layer may be provided on a side surface of the light emitting structure 123. The protective layer may be provided so that the first bonding part 121 and the second bonding part 122 can be exposed. In addition, the protective layer may be selectively provided on the periphery and the lower surface of the substrate 124.

For example, the protective layer may be provided as an insulating material. For example, the protective layer may be formed of at least one material selected from a group including SixOy, SiOxNy, SixNy, and AlxOy.

In the light emitting device according to the embodiment, light generated in the active layer 123b may be emitted in six surface directions of the light emitting device. Light generated in the active layer 123b may be emitted in six surface directions through the upper surface, the lower surface, and four side surfaces of the light emitting device.

For reference, the vertical arrangement direction of the light emitting device described with reference to FIGS. 1 to 11 and the vertical arrangement direction of the light emitting device shown in FIGS. 12 and 13 are shown opposite to each other.

According to the embodiment, the sum of the areas of the first and second bonding parts 121 and 122 may be provided 10% or less with reference to the area of the upper surface of the substrate 124. According to the light emitting device package, the sum of the areas of the first and second bonding parts 121 and 122 may be set to be 10% or less with reference to the area of the upper surface of the substrate 124 in order to secure a light emitting area emitted from the light emitting device and increase the light extraction efficiency.

In addition, according to the embodiment, the sum of the areas of the first and second bonding parts 121 and 122 may be provided 0.7% or more with reference to the area of the upper surface of the substrate 124. According to the light emitting device package, the sum of the areas of the first and second bonding parts 121 and 122 may be set to be 0.7% or more with reference to the area of the upper surface of the substrate 124 in order to provide a stable bonding force to the light emitting device to be mounted.

For example, the width of the first bonding part 121 along the major axis direction of the light emitting device may be provided several tens of micrometers. The width of the first bonding part 121 may be provided, for example, in a range of 70 micrometers to 90 micrometers. Also, the area of the first bonding part 121 may be provided several thousand square micrometers.

In addition, the width of the second bonding part 122 along the major axis direction of the light emitting device may be provided several tens of micrometers. The width of the second bonding part 122 may be provided, for example, in a range of 70 micrometers to 90 micrometers. In addition, the area of the second bonding part 122 may be provided several thousand square micrometers.

As described above, as the areas of the first and second bonding parts 121 and 122 are provided small, the amount of light transmitted to the lower surface of the light emitting device 120 may be increased.

Next, another example of a light emitting device package according to an embodiment will be described with reference to FIG. 14.

FIG. 14 is a view showing another example of the light emitting device package according to the embodiment. In describing the light emitting device package according to the embodiment with reference to FIG. 14, descriptions overlapping with those described with reference to FIGS. 1 to 13 may be omitted.

The light emitting device package described above has been described based on the case where the recess R is disposed under the lower surface of the light emitting device 120, and is not disposed to extend beyond the side surface of the light emitting device 120 when viewed from above the light emitting device package.

However, according to the light emitting device package of the embodiment, as shown in FIG. 14, when viewed from above the light emitting device package, the first and second recesses R31 and R32 disposed under the lower surface of the light emitting device 120 may be disposed to extend beyond the side surface of the light emitting device 120.

A portion of the first and second recesses R31 and R32 is provided extending from the side surface of the light emitting device 120 to the outer region, so that the adhesive provided under the light emitting device 120 can be moved along the first and second recesses R31 and R32 to the outer area of the side surface of the light emitting device 120.

Meanwhile, after an adhesive is provided to the first and second recesses R31 and R32, and a void may be formed in the first and second recesses R31 and R32 in the process of attaching the light emitting device 120 thereon. If a kind of void exists under the light emitting device 120, a popping phenomenon of the void may occur during a subsequent heat treatment process or operation of the light emitting device 120, and thereby the light emitting device may be damaged or reliability may be deteriorated.

However, according to the embodiment, even when voids are formed in the first and second recesses R31 and R32 in the process of attaching the light emitting device 120, the voids can be easily moved outside the side surface of the light emitting device 120 to the outer region. Accordingly, it is possible to prevent the presence of voids under the lower surface of the light emitting device 120, thereby preventing the light emitting device from being damaged and improving the reliability of the light emitting device package.

In addition, the light emitting device package according to the embodiment shown in FIG. 14 has been described based on the case where the first and second recesses R31 and R32 are disposed separated and spaced apart from each other under the light emitting device 120. However, according to an embodiment, the first and second recesses R31 and R32 may be provided connected to each other under the light emitting device 120.

Meanwhile, the light emitting device package according to the embodiment can be applied to the light source device.

Further, the light source device may comprise a display device, a lighting device, a head lamp, and the like depending on an industrial field.

As an example of the light source device, a display device may comprise a bottom cover, a reflector disposed on the bottom cover, a light emitting module including a light emitting device that emits light, a light guide plate disposed in front of the reflector and guiding light emitted from the light emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. In this case, the bottom cover, the reflector, the light emitting module, the light guide plate, and the optical sheet may constitute a backlight unit. In addition, the display device may not include a color filter, and may have a structure in which the light emitting device emitting red, green, and blue light are disposed, respectively.

As another example of the light source device, the head lamp may include a light emitting module including a light emitting device package disposed on a substrate, a reflector for reflecting light emitted from the light emitting module in a predetermined direction, for example, forward, a lens for refracting light reflected by the reflector forward, and a shade for constructing a light distribution pattern desired by designer by blocking or reflecting a portion of the light that is reflected by the reflector to be directed to the lens.

As another example of the light source device, the lighting device may include a cover, a light source module, a heat radiator, a power supply, an inner case, and a socket. In addition, the light source device according to an embodiment may further include at least one of a member and a holder. The light source module may include the light emitting device or the light emitting device package according to the embodiment.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

According to the semiconductor device package and the method of manufacturing the semiconductor device package of the embodiments, there is an advantage that light extraction efficiency, electrical characteristics and reliability can be improved.

According to the semiconductor device package and the method of manufacturing the semiconductor device package of the embodiments, there is an advantage that manufacturing cost can be reduced and manufacturing yield can be improved by improving process efficiency and providing new package structure.

The semiconductor device package according to the embodiment has an advantage that the reflector can be prevented from being discolored by providing the body with high reflectance, thereby improving the reliability of the semiconductor device package.

According to the semiconductor device package and the method of manufacturing the semiconductor device of the embodiments, there is an advantage that re-melting phenomenon can be prevented from occurring in the bonding region of the semiconductor device package in the process of re-bonding the semiconductor device package to a board or the like.

The invention claimed is:
1. A light emitting device package, comprising:
a first frame comprising a first opening passing through an upper surface and a lower surface, and a second frame spaced apart from the first frame and comprising a second opening;

first and second conductive layers disposed in the first and second openings, respectively;
a body disposed between the first and second frames;
a first resin disposed on the body; and
a light emitting device disposed on the first resin,
wherein the light emitting device comprises a first bonding part electrically connected with the first frame, and a second bonding part spaced apart from the first bonding part and electrically connected with the second frame,
wherein the first and second bonding parts are disposed on the first and second openings, respectively,
wherein the first and second frames comprise first and second metal layers including third and fourth openings passing through upper and lower surfaces around the first and second openings, respectively, and
wherein widths of the first and second bonding parts in a horizontal direction are greater than widths of upper surfaces of the first and second openings in the horizontal direction.

2. The light emitting device package according to claim 1, wherein the first frame comprises the first metal layer, a third metal layer disposed on a side surface of the first metal layer, and a fifth metal layer disposed on a side surface of the third metal layer and disposed on an upper surface of the first metal layer, and
wherein the fifth metal layer disposed on the side surface of the third metal layer is disposed around the first conductive layer provided in the first opening.

3. The light emitting device package according to claim 1, further comprising:
a first conductor contacting a lower surface of the first bonding part and disposed in the first opening, and
a second conductor contacting a lower surface of the second bonding part and disposed in the second opening.

4. The light emitting device package according to claim 1, wherein the body comprises a recess recessed in a direction toward the lower surface from the upper surface of the body, and
wherein the first resin is disposed in the recess.

5. The light emitting device package according to claim 1, wherein the first and second frames comprise a lower recess recessed in a direction from the lower surface toward the upper surface.

6. The light emitting device package according to claim 5, further comprising a resin layer disposed in the lower recess.

7. The light emitting device package according to claim 1, wherein the widths of the first and second bonding parts and the widths of the first and second openings are provided in a range of several tens of micrometers.

8. The light emitting device package according to claim 1, wherein the second frame comprises the second metal layer, a fourth metal layer disposed on a side surface of the second metal layer, and a sixth metal layer disposed on a side surface of the fourth metal layer and disposed on an upper surface of the second metal layer, and
wherein the sixth metal layer disposed on the side surface of the fourth metal layer is disposed around the second conductive layer provided in the second opening.

9. The light emitting device package according to claim 3, wherein the first conductive layer contacts a lower surface of the first bonding part and a periphery of the first conductor.

10. The light emitting device package according to claim 1, wherein an alloy layer formed of a first metal included in the first conductive layer and a second metal included in the first frame is disposed between the first conductive layer and the first frame.

11. A light emitting device package, comprising:
a first frame comprising a first opening;
a second frame spaced apart from the first frame and comprising a second opening;
first and second conductive layers disposed in the first and second openings, respectively;
a body disposed between the first and second frames;
a first resin disposed on the body; and
a light emitting device disposed on the first resin,
wherein the light emitting device comprises a first bonding part electrically connected with the first frame, and a second bonding part spaced apart from the first bonding part and electrically connected with the second frame,
wherein the first frame comprises a first metal layer disposed around the first opening, a third metal layer disposed on a side surface of the first metal layer, and a fifth metal layer disposed on a side surface of the third metal layer and disposed on an upper surface of the first metal layer,
wherein the fifth metal layer disposed on the side surface of the third metal layer is disposed around the first conductive layer provided in the first opening,
wherein the second frame comprises a second metal layer disposed around the second opening, a fourth metal layer disposed on a side surface of the second metal layer, and a sixth metal layer disposed on a side surface of the fourth metal layer and disposed on an upper surface of the second metal layer, and
wherein the sixth metal layer disposed on the side surface of the fourth metal layer is disposed around the second conductive layer provided in the second opening.

12. The light emitting device package according to claim 11, wherein the fifth metal layer faces the first conductive layer in the first opening, and the sixth metal layer faces the second conductive layer in the second opening.

13. The light emitting device package according to claim 11, further comprising:
a first conductor in contact with a lower surface of the first bonding part and disposed in the first opening; and
a second conductor in contact with a lower surface of the second bonding part and disposed in the second opening.

14. The light emitting device package according to claim 13, wherein the first conductive layer contacts a lower surface of the first bonding part and a periphery of the first conductor, and
wherein the second conductive layer contacts a lower surface of the second bonding part and a periphery of the second conductor.

15. The light emitting device package according to claim 11, wherein widths of the first and second bonding parts in a horizontal direction are greater than widths of upper surfaces of the first and second openings in the horizontal direction.

16. The light emitting device package according to claim 11, wherein the body comprises a recess recessed in a direction toward the lower surface from the upper surface of the body, and
wherein the first resin is disposed in the recess.

17. The light emitting device package according to claim 11, wherein the widths of the first and second bonding parts and the widths of the first and second openings are provided in a range of several tens of micrometers.

18. A light emitting device package, comprising:
a first frame comprising a first opening;
a second frame spaced apart from the first frame and comprising a second opening;
first and second conductive layers disposed in the first and second openings, respectively;
a body disposed between the first and second frames;
a first resin disposed on the body; and
a light emitting device disposed on the first resin,
wherein the light emitting device comprises a first bonding part electrically connected with the first frame, and a second bonding part spaced apart from the first bonding part and electrically connected with the second frame, and
wherein an alloy layer comprising a first metal included in the first conductive layer and a second metal included in the first frame is disposed between the first conductive layer and the first frame.

19. The light emitting device package according to claim 18, wherein the first frame comprises the first metal layer disposed around the first opening, a third metal layer disposed on a side surface of the first metal layer, and a fifth metal layer disposed on a side surface of the third metal layer and disposed on an upper surface of the first metal layer,
wherein the fifth metal layer disposed on the side surface of the third metal layer is disposed around the first conductive layer provided in the first opening,
wherein the second frame comprises the second metal layer disposed around the second opening, a fourth metal layer disposed on a side surface of the second metal layer, and a sixth metal layer disposed on a side surface of the fourth metal layer and disposed on an upper surface of the second metal layer, and
wherein the sixth metal layer disposed on the side surface of the fourth metal layer is disposed around the second conductive layer provided in the second opening.

20. The light emitting device package according to claim 18, further comprising:
a first conductor in contact with a lower surface of the first bonding part and disposed in the first opening; and
a second conductor in contact with a lower surface of the second bonding part and disposed in the second opening.

* * * * *